(12) United States Patent
Chien et al.

(10) Patent No.: US 11,295,055 B2
(45) Date of Patent: Apr. 5, 2022

(54) TRANSMISSION GATE STRUCTURE AND METHOD

(71) Applicant: TAIWAN SEMICONDUCTOR MANUFACTURING COMPANY, LTD., Hsinchu (TW)

(72) Inventors: Shao-Lun Chien, Hsinchu (TW); Pin-Dai Sue, Hsinchu (TW); Li-Chun Tien, Hsinchu (TW); Ting-Wei Chiang, Hsinchu (TW); Ting Yu Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/116,745

(22) Filed: Dec. 9, 2020

(65) Prior Publication Data

US 2021/0089702 A1  Mar. 25, 2021

Related U.S. Application Data

(63) Continuation of application No. 16/530,703, filed on Aug. 2, 2019, now Pat. No. 10,867,113.

(Continued)

(51) Int. Cl.
*G06F 30/398* (2020.01)
*G03F 1/36* (2012.01)
(Continued)

(52) U.S. Cl.
CPC .............. *G06F 30/398* (2020.01); *G03F 1/36* (2013.01); *G06F 30/392* (2020.01); *G06F 30/394* (2020.01)

(58) Field of Classification Search
USPC ......................................................... 716/110
See application file for complete search history.

(56) References Cited

U.S. PATENT DOCUMENTS 7,260,442 B2   8/2007  Hwang et al.
9,256,709 B2   2/2016  Yu et al.
(Continued)

FOREIGN PATENT DOCUMENTS

CN    108172571      6/2018
KR    20150136568    12/2015
(Continued)

OTHER PUBLICATIONS

Office Action dated Sep. 28, 2021 for corresponding case No. CN 201910837850.X (pp. 1-7).

(Continued)

*Primary Examiner* — Mohammed Alam
(74) *Attorney, Agent, or Firm* — Hauptman Ham, LLP

(57) ABSTRACT

A transmission gate structure includes two PMOS transistors in a first active area, two NMOS transistors in a second active area, a first metal zero segment overlying the first active area, a second metal zero segment offset from the first metal zero segment by a distance, a third metal zero segment offset from the second metal zero segment by the distance, a fourth metal zero segment offset from the third metal zero segment by the distance and overlying the second active area. A first conductive segment overlies a first portion of the first active area included in one or both PMOS transistors, and a second conductive segment overlies a second portion of the second active area included in one or both NMOS transistors. The active areas and metal zero segments are perpendicular to the conductive segments, and the PMOS and NMOS transistors are coupled together through the conductive segments.

20 Claims, 22 Drawing Sheets

Related U.S. Application Data

(60) Provisional application No. 62/727,903, filed on Sep. 6, 2018.

(51) Int. Cl.
    *G06F 30/392*     (2020.01)
    *G06F 30/394*     (2020.01)

(56) References Cited

U.S. PATENT DOCUMENTS

| | | |
|---|---|---|
| 9,767,243 B2 | 9/2017 | Chiang et al. |
| 10,249,605 B2 | 4/2019 | Subhash et al. |
| 2005/0020020 A1* | 1/2005 | Collaert ............. H01L 27/1211 438/300 |
| 2014/0040838 A1* | 2/2014 | Liu ........................ G03F 1/36 716/53 |
| 2015/0278429 A1 | 10/2015 | Chang |
| 2015/0347659 A1 | 12/2015 | Chiang et al. |
| 2016/0093628 A1 | 3/2016 | Chen et al. |
| 2016/0218071 A1 | 7/2016 | Nam et al. |
| 2016/0300839 A1 | 10/2016 | Kim et al. |
| 2018/0076190 A1 | 3/2018 | Tien et al. |
| 2018/0150586 A1* | 5/2018 | Tien .................... H01L 27/0207 |
| 2018/0158811 A1 | 6/2018 | Subhash et al. |
| 2019/0251223 A1* | 8/2019 | Chang ............... H01L 27/11206 |
| 2020/0082052 A1* | 3/2020 | Chien .................. G06F 30/394 |

FOREIGN PATENT DOCUMENTS

| | | |
|---|---|---|
| KR | 10-2016-0120644 | 10/2016 |
| KR | 10-2018-0065427 | 6/2018 |

OTHER PUBLICATIONS

Office Action dated Feb. 16, 2021 for corresponding case No. KR 10-2019-0110996. (pp. 1-4).

\* cited by examiner

1900

1910 — Overlie first and second active areas with first and second metal zero segments, the metal zero segments having an offset distance corresponding to three times a metal zero track pitch 1920 — Form three conductive paths to configure first and second PMOS transistors in the first active area and first and second NMOS transistors in the second active area as a transmission gate, at least one of the conductive paths including a conductive segment perpendicular to the metal zero segments 1930 — Form one or more additional conductive paths

FIG. 19

TRANSMISSION GATE STRUCTURE AND METHOD

PRIORITY CLAIM

The present application is a continuation of U.S. application Ser. No. 16/530,703, filed Aug. 2, 2019, which claims the priority of U.S. Provisional Application No. 62/727,903, filed Sep. 6, 2018, each of which is incorporated herein by reference in its entirety.

BACKGROUND

Integrated circuits (ICs) sometimes include transmission gates as either stand-alone units or combined with additional circuit components to enable high level functions. In transmission gates, p-type metal-oxide-semiconductor (PMOS) transistors operate simultaneously with n-type metal-oxide-semiconductor (NMOS) transistors to control current flow.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19 is a flowchart of a method of manufacturing an IC structure, in accordance with some embodiments.

DETAILED DESCRIPTION

Figure 1:
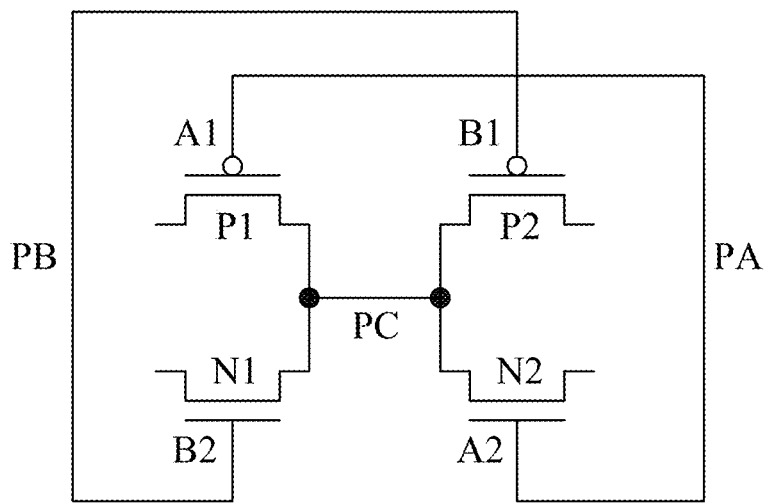
FIG. 1 is a schematic diagram of a transmission gate, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a transmission gate includes first and second PMOS transistors, first and second NMOS transistors, at least two metal zero segments, a conductive path between gates of the first PMOS and second NMOS transistors, a conductive path between gates of the second PMOS and first NMOS transistors, and a conductive path connecting a source-drain (S/D) terminal of each of the transistors together. At least one of the conductive paths includes a conductive segment perpendicular to the metal zero segments, the transmission gate thereby being arranged using metal zero segments corresponding to a total of four metal zero tracks. Compared to approaches based on more than four metal zero tracks, the transmission gate embodiments have lower profiles and are capable of being included in circuit layouts based on cell heights corresponding to four metal zero tracks.

FIG. 1 is a schematic diagram of a transmission gate 100, in accordance with some embodiments. Transmission gate 100 includes PMOS transistors P1 and P2, NMOS transistors N1 and N2, a conductive path PA between a gate A1 of transistor P1 and a gate A2 of transistor N2, a conductive path PB between a gate B1 of transistor P2 and a gate B2 of transistor N1, and a conductive path PC connecting a S/D terminal (not labeled) of each of transistors P1, P2, N1, and N2 together.

In some embodiments, transmission gate 100 is formed by executing some or all of the operations of method 1900 and/or method 2000 and/or is configured based on an IC layout diagram 200A-1800A corresponding to a respective IC structure 200B-1800B discussed below with respect to FIGS. 2-18. In some embodiments, transmission gate 100 is included in an IC device 2260 manufactured by an IC manufacturer/fabricator ("fab") 2250, discussed below with respect to FIG. 22.

At least one of conductive paths PA, PB, or PC includes a conductive segment perpendicular to metal zero segments, and transmission gate 100 is thereby arranged using metal zero segments corresponding to a total of four metal zero tracks, as discussed below with respect to FIGS. 2-18. In some embodiments, at least one of conductive paths PA, PB, or PC includes a metal zero segment and a conductive segment perpendicular to the metal zero segments.

Each of FIGS. 2-18 includes a diagram that represents both a given one of IC layout diagrams 200A-1800A and a corresponding one of IC structures 200B-1800B manufactured based on the given IC layout diagram, and thereby depicts a non-limiting example of an embodiment of transmission gate 100 in which at least one of conductive paths PA, PB, or PC includes a conductive segment perpendicular to metal zero segments.

Each of transistors P1, P2, N1, and N2 includes, in addition to the S/D terminal connected to conductive path PC, a second S/D terminal (not labeled). In various embodiments, transmission gate 100 is configured such that one or more of the second S/D terminals is electrically connected to one or more circuits (not shown) external to transmission gate 100.

In various embodiments, transmission gate 100 includes conductive paths connected to the second S/D terminals of transistors P1, P2, N1, and N2 that are not depicted in FIGS. 1-18 for the purpose of clarity. In various embodiments, transmission gate 100 includes the conductive paths connecting the second S/D terminals of transistors P1 and N1 to each other and/or the conductive paths connecting the second S/D terminals of transistors P2 and N2 to each other.

The diagrams of FIGS. 2-18 are simplified for the purpose of clarity. FIGS. 2-18 depict views of respective IC layout diagrams 200A-1800A and IC structures 200B-1800B with various features included and excluded to facilitate the discussion below. In various embodiments, one or more of IC layout diagrams 200A-1800A or IC structures 200B-1800B includes one or more elements corresponding to metal interconnects, contacts, vias, gate structure or other transistor elements, wells, isolation structures, or the like, in addition to the elements depicted in FIGS. 2-18.

In various embodiments, one or more of IC layout diagrams 200A-1800A or IC structures 200B-1800B includes one or more elements (not shown) corresponding to one or more conductive paths configured to form one or more electrical connections to one or more of the second S/D terminals of transistors P1, P2, N1, and/or N2.

FIGS. 2-18 depict respective IC layout diagrams 200A-1800A and IC structures 200B-1800B having an indicated orientation with respect to X and Y directions as discussed below. In various embodiments, one or more of IC layout diagrams 200A-1800A or IC structures 200B-1800B has an orientation relative to the X and Y directions other than the orientation depicted in FIGS. 2-18, e.g., rotated or inverted with respect to one or both of the X or Y directions.

FIGS. 2-18 depict respective IC layout diagrams 200A-1800A including active regions AR1 and AR2 corresponding to active areas AA1 and AA2 of respective IC structures 200B-1800B. An active region, e.g., active region AR1 or AR2, is a region in an IC layout diagram included in a manufacturing process as part of defining an active area, e.g., active area AA1 or AA2, also referred to as an oxide diffusion or definition (OD), in a semiconductor substrate. In the non-limiting examples depicted in FIGS. 2-18, active regions AR1 and AR2, and thereby active areas AA1 and AA2, have an orientation along the X direction.

An active area is a continuous section of the semiconductor substrate having either n-type or p-type doping that includes various semiconductor structures, including S/D structures. In various embodiments, an active area is an n-type or p-type active area of a planar transistor or a fin, field-effect transistor (FinFET) and/or is located within a well (not shown), i.e., either an n-well or a p-well, within the semiconductor substrate. In some embodiments, an active area AA is electrically isolated from other elements in the semiconductor substrate by one or more isolation structures (not shown), e.g., one or more shallow trench isolation (STI) structures.

A S/D structure is a semiconductor structure within an active area and configured to have a doping type opposite to that of other portions of the active area. In some embodiments, a S/D structure is configured to have lower resistivity than other portions of the active area, e.g., by including one or more portions having doping concentrations greater than one or more doping concentrations otherwise present throughout the active area. In various embodiments, S/D structures include epitaxial regions of a semiconductor material, e.g., silicon (Si), silicon-germanium (SiGe), and/or silicon-carbide (SiC).

In the non-limiting examples depicted in FIGS. 2-18, the S/D terminals of transistors P1, P2, N1, and N2 correspond to S/D structures in portions of active areas AA1 and AA2 adjacent to various subsets of gate structures G1-G8 included in transistors P1, P2, N1, and N2 as discussed below. The S/D structures included in the relevant portions of active areas AA1 and AA2 are not shown in FIGS. 2-18 for the purpose of clarity.

FIGS. 2-18 depict respective IC layout diagrams 200A-1800A including a subset of metal-like defined (MD) regions DR1-DR13 corresponding to MD segments MD1-MD13 of respective IC structures 200B-1800B. An MD region, e.g., one of MD regions DR1-DR13, is a conductive region in an IC layout diagram included in a manufacturing process as part of defining an MD segment, e.g., one of MD segments MD1-MD13, also referred to as a conductive segment or MD conductive line or trace, in and/or on a semiconductor substrate. In the non-limiting examples depicted in FIGS. 2-18, MD regions DR1-DR13, and thereby MD segments MD1-MD13, have an orientation along the Y direction.

In some embodiments, an MD segment includes a portion of at least one metal layer, e.g., a contact layer, overlying and contacting the substrate and having a thickness sufficiently small to enable formation of an insulation layer between the MD segment and an overlying metal layer, e.g., a metal zero layer. In various embodiments, an MD segment includes one or more of copper (Cu), silver (Ag), tungsten (W), titanium (Ti), nickel (Ni), tin (Sn), aluminum (Al) or another metal or material suitable for providing a low resistance electrical connection between IC structure elements, i.e., a resistance level below a predetermined threshold corresponding to one or more tolerance levels of a resistance-based effect on circuit performance.

In various embodiments, an MD segment includes a section of the semiconductor substrate and/or an epitaxial layer having a doping level, e.g., based on an implantation process, sufficient to cause the segment to have the low resistance level. In various embodiments, a doped MD segment includes one or more of silicon (Si), silicon-germanium (SiGe), silicon-carbide (SiC), boron (B), phosphorous (P), arsenic (As), gallium (Ga), a metal as discussed above, or another material suitable for providing the low resistance level. In some embodiments, an MD segment includes a dopant having a doping concentration of about $1*10^{16}$ per cubic centimeter ($cm^{-3}$) or greater.

In various embodiments, one or more MD regions, e.g., one or more of MD regions DR1-DR13, overlaps one or more active regions, e.g., one or both of active regions AR1 or AR2, and the corresponding one or more MD segments, e.g., one or more of MD segments MD1-MD13, includes at least a portion within the corresponding one or more active areas, e.g., one or both of active areas AA1 or AA2. In various embodiments, one or more MD segments, e.g., one or more of MD segments MD1-MD13, abuts or includes some or all of one or more S/D structures in the corresponding one or more active areas, e.g., one or both of active areas AA1 or AA2.

FIGS. 2-18 depict respective IC layout diagrams 200A-1800A including some or all of gate regions GR1-GR8 corresponding to gate structures G1-G6 of respective IC structures 200B-1800B. A gate region, e.g., one of gate regions GR1-GR8, is a region, also referred to as a conductive region in some embodiments, in an IC layout diagram included in a manufacturing process as part of defining a gate structure, e.g., one of gate structures G1-G8, overlying the semiconductor substrate. In the non-limiting examples depicted in FIGS. 2-18, gate regions GR1-GR8, and thereby gate structures G1-G8, have an orientation along the Y direction.

As depicted in FIGS. 2-18, in some cases, a location at which a gate region intersects an active region in an IC layout diagram corresponds to a transistor, e.g., one of transistors P1, P2, N1, or N2, in the corresponding IC structure that includes the portion of the corresponding gate structure overlying the corresponding active area and portions of the active area below and adjacent to the gate structure.

In the non-limiting examples depicted in FIGS. 2-18, each of IC layout diagrams 200A-1800A includes gate region GR1 and a highest numbered one of gate regions GR1-GR8 intersecting active regions AR1 and AR2 at locations that do not correspond to transistors in respective IC structures 200B-1800B. Gate region GR1 and the highest numbered one of gate regions GR1-GR8 are thereby used to define the corresponding gate structures G1 and a highest numbered one of gate structures G1-G8 as dummy gate structures. In various embodiments, one or more of IC layout diagrams 200A-1800A does not includes gate region GR1 and/or a highest numbered one of gate regions GR1-GR8 that corresponds to a dummy gate structure in the corresponding one or more of IC structures 200B-1800B.

A gate structure, e.g., one of gate structures G1-G8, is a volume including one or more conductive segments including one or more conductive materials, e.g., polysilicon, one or more metals, and/or one or more other suitable materials, substantially surrounded by one or more insulating materials, e.g., silicon dioxide and/or one or more other suitable materials, the one or more conductive segments thereby being configured to control a voltage provided to an underlying dielectric layer. In various embodiments, a dielectric layer includes one or more of silicon dioxide and/or a high-k dielectric material, e.g., a dielectric material having a k value higher than 3.8 or 7.0. In some embodiments, a high-k dielectric material includes aluminum oxide, hafnium oxide, lanthanum oxide, or another suitable material.

FIGS. 2-18 depict respective IC layout diagrams 200A-1800A including metal zero regions ZR1-ZR4 corresponding to metal zero segments M01-M04 of respective IC structures 200B-1800B. A metal zero region, e.g., one of metal zero regions ZR1-ZR4, is a conductive region in an IC layout diagram included in a manufacturing process as part of defining a segment, e.g., one of metal zero segments M01-M04, also referred to as a conductive segment or conductive line, of a metal zero layer of the manufacturing process. Metal zero regions intersect gate regions and are used to define metal zero segments that overlie the semiconductor substrate and one or more gate structures. In the non-limiting examples depicted in FIGS. 2-18, metal zero regions ZR1-ZR4, and thereby metal zero segments M01-M04, have an orientation along the X direction.

A metal segment, e.g., a metal zero, metal one, or metal two segment, is a portion of a corresponding metal layer, e.g., a metal zero, metal one, or metal two layer, that includes one or more of copper (Cu), silver (Ag), tungsten (W), titanium (Ti), nickel (Ni), tin (Sn), aluminum (Al) or another metal or material suitable for providing a low resistance electrical connection between IC structure elements.

Metal zero regions ZR1-ZR4 are positioned in each of IC layout diagrams 200A-1800A based on respective tracks T1-T4 having a pitch ZP, also referred to as a metal zero track pitch, in the Y direction. Tracks T1-T4 are consecutive tracks such that any two consecutive metal zero regions of metal zero regions ZR1-ZR4 are separated by pitch ZP. Pitch ZP corresponds to each metal zero segment M01-M04 of respective IC structures 200B-1800B being offset from each adjacent metal zero segment of metal zero segments M01-M04 by an offset distance ZD in the Y direction. Accordingly, metal zero segment M02 is offset from metal zero segment M01 by offset distance ZD based on pitch ZP, metal zero segment M03 is offset from metal zero segment M02 by offset distance ZD based on pitch ZP, and metal zero segment M04 is offset from metal zero segment M03 by offset distance ZD based on pitch ZP.

By the configuration discussed above, tracks T1-T4 are arranged to span a region (not labeled) in each of IC layout diagrams 200A-1800A that includes active regions AR1 and AR2, and metal segments M01-M04 are configured to span an area (not labeled) in each of IC structures 200B-1800B that includes active areas AA1 and AA2.

In the non-limiting examples depicted in FIGS. 2-8 and 12-18, each metal zero region of metal zero regions ZR1-ZR4 is a single, continuous metal region positioned at a corresponding one of tracks T1-T4, and each metal zero segment of metal zero segments M01-M04 is a corresponding single, continuous metal zero segment extending along the X direction. In various embodiments, e.g., the non-limiting examples depicted in FIGS. 9-11, a given metal zero region of metal zero regions ZR1-ZR4 includes one or more gaps such that the given metal zero region includes a plurality of metal zero regions positioned at the corresponding one of tracks T1-T4, and the corresponding metal zero segment of metal zero segments M01-M04 includes a plurality of metal zero segments extending along the X direction.

In the non-limiting examples depicted in FIGS. 2-18, each metal zero region of metal zero regions ZR1-ZR4 (including any plurality of metal regions) extends from gate region GR1 to a highest numbered one of gate regions GR2-GR8 such that each of metal zero regions ZR1-ZR4 has a same region length (not labeled). Accordingly, each metal zero segment of metal zero segments M01-M04 (including any plurality of metal zero segments) extends from gate structure G1 to the highest numbered one of gate structures G2-G8 and has a same segment length (not labeled).

In various embodiments, one or more metal zero regions of metal zero regions ZR1-ZR4 extends from a position away from gate region GR1 in the positive or negative X direction and/or to a position away from the highest numbered one of gate regions GR2-GR8 in the positive or negative X direction such that one or more metal zero regions of metal zero regions ZR1-ZR4 has the region length different from the region length(s) of one or more other metal zero regions of metal zero regions ZR1-ZR4. In accordance with such embodiments, one or more metal zero segments of metal zero segments M01-M04 extends from a position away from gate structure G1 in the positive or negative X direction and/or to a position away from the highest numbered one of gate structures G2-G8 in the positive or negative X direction such that one or more metal zero segments of metal zero segments M01-M04 has the segment length different from the segment length(s) of one or more other metal zero segments of metal zero segments M01-M04.

Metal zero region ZR1 overlaps active region AR1 and metal region ZR4 overlaps active region AR2 such that a total of two metal zero regions, metal zero regions ZR2 and ZR3, are positioned between active regions AR1 and AR2. Accordingly, metal zero segment M01 overlies active area AA1 and metal zero segment M04 overlies active area AA2 such that a total of two metal zero segments, metal zero segments M02 and M03, are positioned between active areas AA1 and AA2.

In the non-limiting examples depicted in FIGS. 2-18, metal zero region ZR1 overlaps active region AR1 such that a lowermost border of metal zero region ZR1 in the Y direction is aligned with a lowermost border of active region AR1 in the Y direction or such that the lowermost border of metal zero region ZR1 is below the lowermost border of active region AR1 in the Y direction. Accordingly, metal zero segment M01 overlies active area AA1 such that a lowermost border of metal zero segment M01 in the Y direction is aligned with a lowermost border of active area AA1 in the Y direction or such that the lowermost border of metal zero segment M01 is below the lowermost border of active area AA1 in the Y direction. In some embodiments, an IC layout diagram, e.g., one of IC layout diagrams 200A-1800A, is otherwise configured such that metal zero region ZR1 overlaps active region AR1 and metal zero segment M01 overlies active area AA1.

In the non-limiting examples depicted in FIGS. 2-18, metal zero region ZR4 overlaps active region AR2 such that an uppermost border of metal zero region ZR4 in the Y direction is aligned with an uppermost border of active region AR2 in the Y direction or such that the uppermost border of metal zero region ZR4 is above the uppermost border of active region AR2 in the Y direction. Accordingly, metal zero segment M04 overlies active area AA2 such that an uppermost border of metal zero segment M04 in the Y direction is aligned with an uppermost border of active area AA2 in the Y direction or such that the uppermost border of metal zero segment M04 is above the uppermost border of active area AA2 in the Y direction. In some embodiments, an IC layout diagram, e.g., one of IC layout diagrams 200A-1800A, is otherwise configured such that metal zero region ZR4 overlaps active region AR2 and metal zero segment M04 overlies active area AA2.

In the non-limiting examples depicted in FIGS. 2-18, based on the configuration discussed above, metal zero segment M01, overlying active area AA1, and metal zero segment M04, overlying active area AA2, are offset from each other by a distance equal to three times offset distance ZD based on pitch ZP such that active areas AA1 and AA2 are separated by a distance (not labeled) less than three times offset distance ZD.

In the non-limiting examples depicted in FIGS. 2-18, metal zero region ZR1 overlaps the one or more of MD regions DR1-DR7 included in each IC layout diagram embodiment such that metal zero segment M01 overlies each of the one or more MD segments MD1-MD7 included in the corresponding IC structure embodiment, and metal zero region ZR4 overlaps the one or more of MD regions DR8-DR14 included in each IC layout diagram embodiment such that metal zero segment M04 overlies each of the one or more MD segments MD8-MD14 included in the corresponding IC structure embodiment.

In the non-limiting examples depicted in FIGS. 2-18, each of IC layout diagrams 200A-1800A includes a total of four metal zero regions ZR1-ZR4, and each of IC structures 200B-1800B includes a total of four metal zero segments M01-M04. In various embodiments, an IC layout diagram, e.g., one of IC layout diagrams 200A-1800A, includes one or more metal zero regions (not shown), e.g., one or more power rail regions, in addition to metal zero regions ZR1-ZR4 and positioned above active region AR1 in the Y direction and/or below active region AR2 in the Y direction. In various embodiments, an IC structure, e.g., one of IC structures 200B-1800B, includes one or more metal zero segments (not shown), e.g., one or more power rails, in addition to metal zero segments M01-M04 and positioned above active area AA1 in the Y direction and/or below active area AA2 in the Y direction.

In various embodiments, an IC layout diagram, e.g., one of IC layout diagrams 200A-1800A, includes fewer than four metal zero regions, and the corresponding IC structure, e.g., one of IC structures 200B-1800B, includes fewer than four metal zero segments. In such embodiments, each of the metal zero regions is aligned with one of four metal zero tracks, e.g., tracks T1-T4, spanning the region including the two active regions, e.g., active regions AR1 and AR2, the corresponding metal zero segments thereby having corresponding offset distances consistent with spanning the area including the two active areas, e.g., active areas AA1 and AA2.

Figure 10:
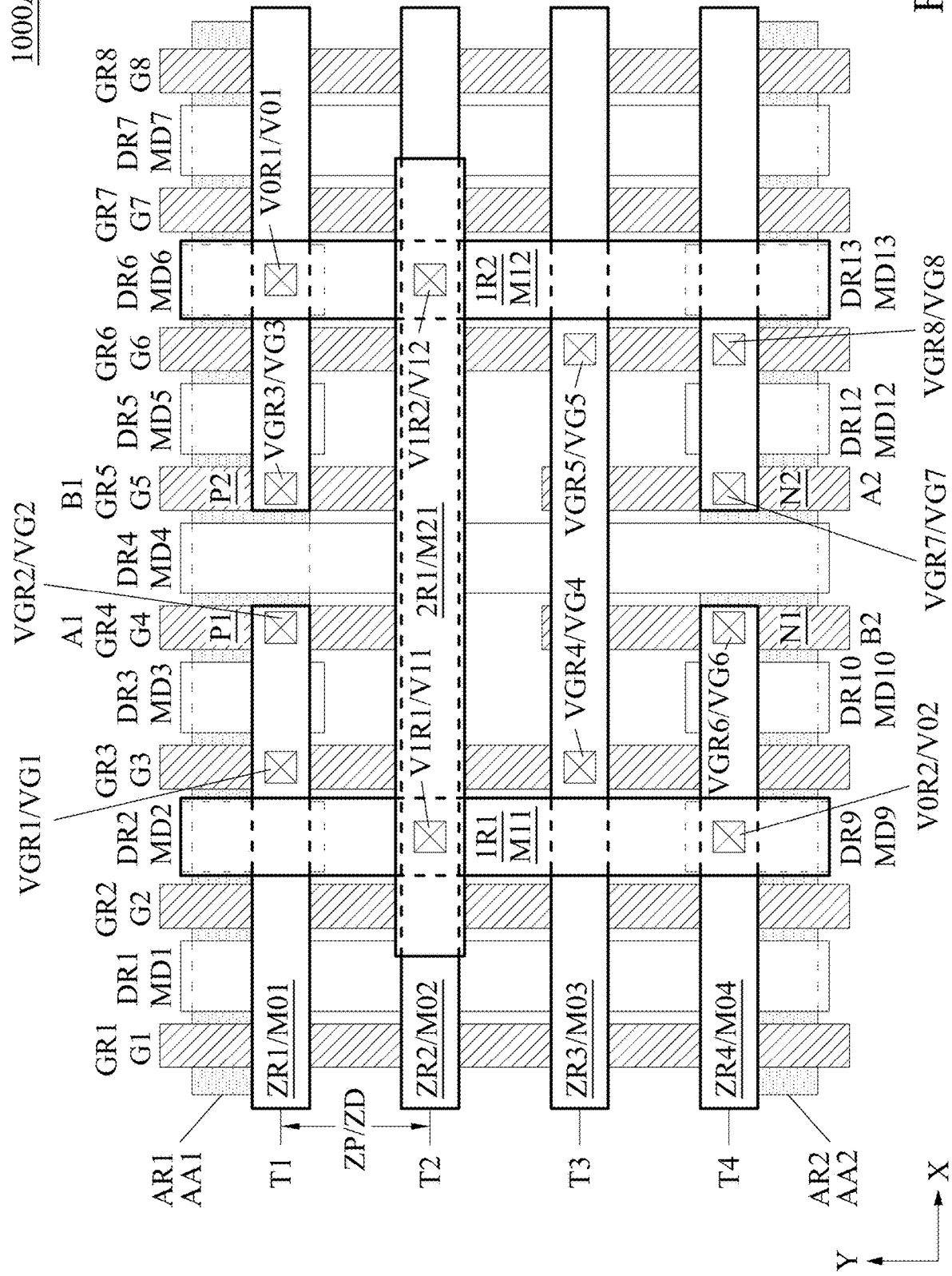
FIG. 10 is a diagram of an IC layout diagram and an IC structure, in accordance with some embodiments.
Figure 11:
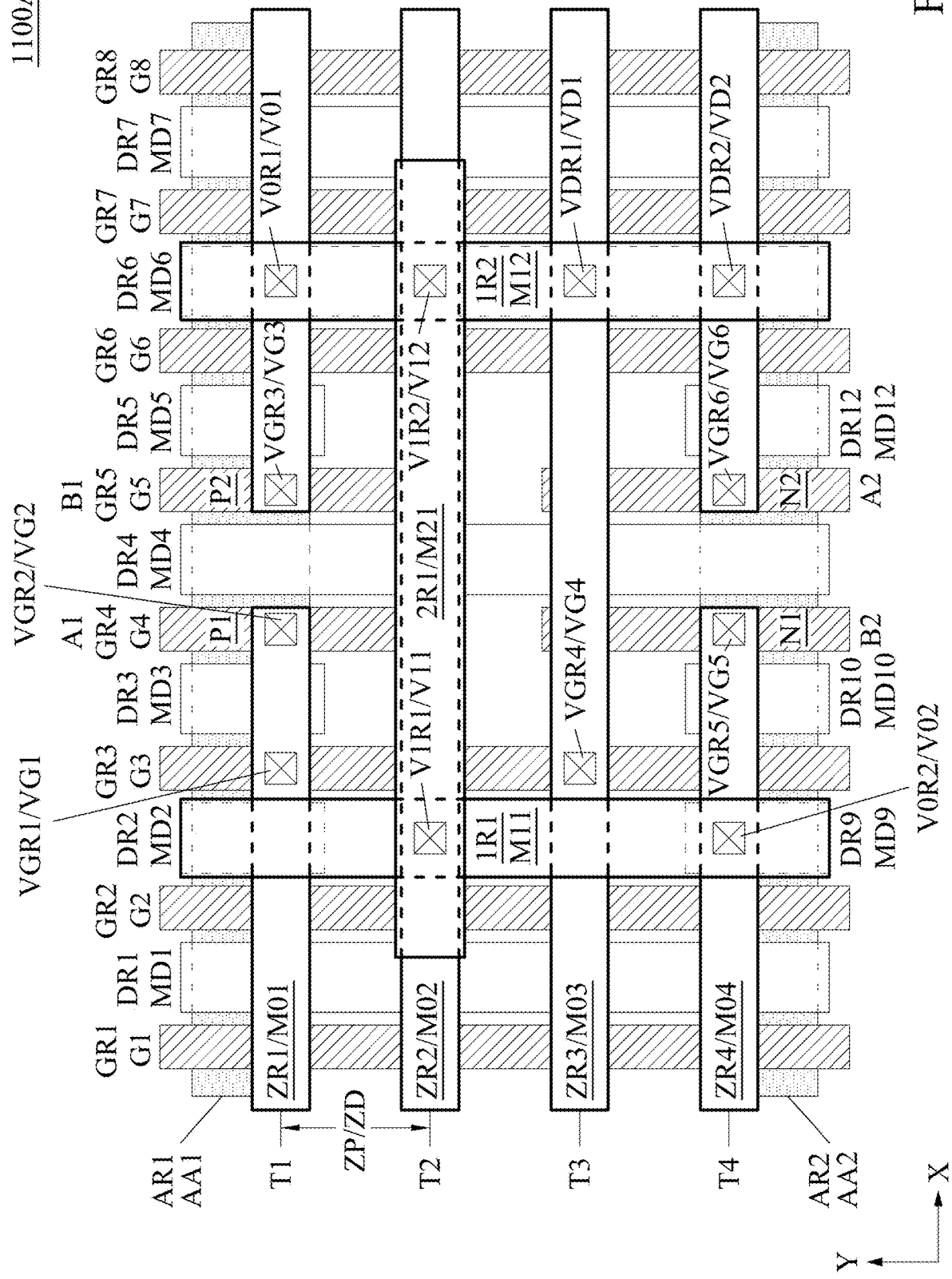
FIG. 11 is a diagram of an IC layout diagram and an IC structure, in accordance with some embodiments.

FIGS. 2-7, 10, 11, and 14 depict respective IC layout diagrams 200A-700A, 1000A, 1100A, and 1400A including a metal one region 1R1 corresponding to a metal one segment M11 of respective IC structures 200B-700B, 1000B, 1100B, and 1400B, and FIGS. 10 and 11 depict respective IC layout diagrams 1000A and 1100A including a metal one region 1R2 corresponding to a metal one segment M12 of respective IC structures 1000B and 1100B. A metal one region, e.g., metal one region 1R1 or 1R2, is a conductive region in an IC layout diagram included in a manufacturing process as part of defining a segment, e.g., metal one segment M11 or M12, also referred to as a conductive segment or conductive line, of a metal one layer of the manufacturing process. Metal one regions intersect one or more active regions and one or more metal zero regions and are used to define metal one segments that overlie the semiconductor substrate, one or more active areas, and one or more metal zero segments. In the non-limiting examples depicted in FIGS. 2-7, 10, 11, and 14, metal one regions 1R1 and, if present 1R2, and thereby metal one segments M11 and, if present M12, have an orientation along the Y direction.

FIGS. 10 and 11 depict respective IC layout diagrams 1000A and 1100A including a metal two region 2R2 corresponding to a metal two segment M21 of respective IC structures 1000B and 1100B. A metal two region, e.g., metal two region 2R1, is a conductive region in an IC layout diagram included in a manufacturing process as part of defining a segment, e.g., metal two segment M21, also referred to as a conductive segment or conductive line, of a metal two layer of the manufacturing process. Metal two regions intersect one or more gate regions and one or more metal one regions and are used to define metal two segments that overlie the semiconductor substrate, one or more gate structures, and one or more metal one segments. In the non-limiting examples depicted in FIGS. 10 and 11, metal two region 2R1, and thereby metal two segment M21, have an orientation along the X direction.

FIGS. 2-18 depict respective IC layout diagrams 200A-1800A including various subsets of via regions VDR1-VDR4, VGR1-VGR8, V0R1, V0R2, V1R1, and V1R2 corresponding to respective via structures VD1-VD4, VG1-VG8, V01, V02, V11, and V12 of respective IC structures 200B-1800B. A via region, e.g., one of via regions VDR1-VDR4, VGR1-VGR8, V0R1, V0R2, V1R1, or V1R2, is a region in an IC layout diagram included in a manufacturing process as part of defining a via structure, e.g., one of via structures VD1-VD4, VG1-VG8, V01, V02, V11, or V12, configured to provide a low resistance electrical connection between conductive segments in two or more levels and/or layers of the manufacturing process. Via structures include one or more of copper (Cu), silver (Ag), tungsten (W), titanium (Ti), nickel (Ni), tin (Sn), aluminum (Al) or another metal or material suitable for providing low resistance electrical connections between IC structure layers.

Via regions VDR1-VDR4 overlap MD regions DR1-DR13 and metal zero regions ZR1-ZR4 and correspond to respective via structures VD1-VD4 configured to electrically connect underlying MD segments of MD segments MD1-MD13 to overlying metal zero segments of metal zero segments M01-M04. Via regions VGR1-VGR4 overlap gate regions GR1-GR8 and metal zero regions ZR1-ZR4 and correspond to respective via structures VG1-VG8 configured to electrically connect underlying gate structures of gate structures G1-G8 to overlying metal zero segments of metal zero segments M01-M04. Via regions V0R1 and V0R2 overlap metal zero regions ZR1-ZR4 and metal one regions 1R1 and 1R2 and correspond to respective via structures V01 and V02 configured to electrically connect underlying metal zero segments of metal zero segments M01-M04 to overlying metal one segments M11 or M12. Via regions V1R1 and V1R2 overlap metal one regions 1R1 and 1R2 and metal two regions 2R1 and 2R2 and correspond to respective via structures V11 and V12 configured to electrically connect underlying metal one segments M11 or M12 to overlying metal two segment M21.

As discussed below, FIGS. 2-18 provide non-limiting examples in which the elements discussed above are arranged to correspond to the transmission gate of FIG. 1 using metal zero segments corresponding to a total of four metal zero tracks. Each of IC layout diagrams 200A-700A includes via regions VGR1-VGR8 overlapping gate regions GR1-GR8 and either metal zero region ZR2 or ZR3, and is free from including a via region of via regions VGR1-VGR8 overlapping metal zero region M01 or M04. In contrast, each of IC layout diagrams 800A-1800A includes at least one via region of via regions VGR1-VGR8 overlapping at least one of metal zero region ZR1 and active region AR1 or metal zero region ZR4 and active region AR2 such that the corresponding IC structure 800B-1800B includes at least one via structure VG1-VG8 either overlying active area AA1 and underlying metal zero segment M01 or overlying active area AA2 and underlying metal zero segment M04.

Figure 2:
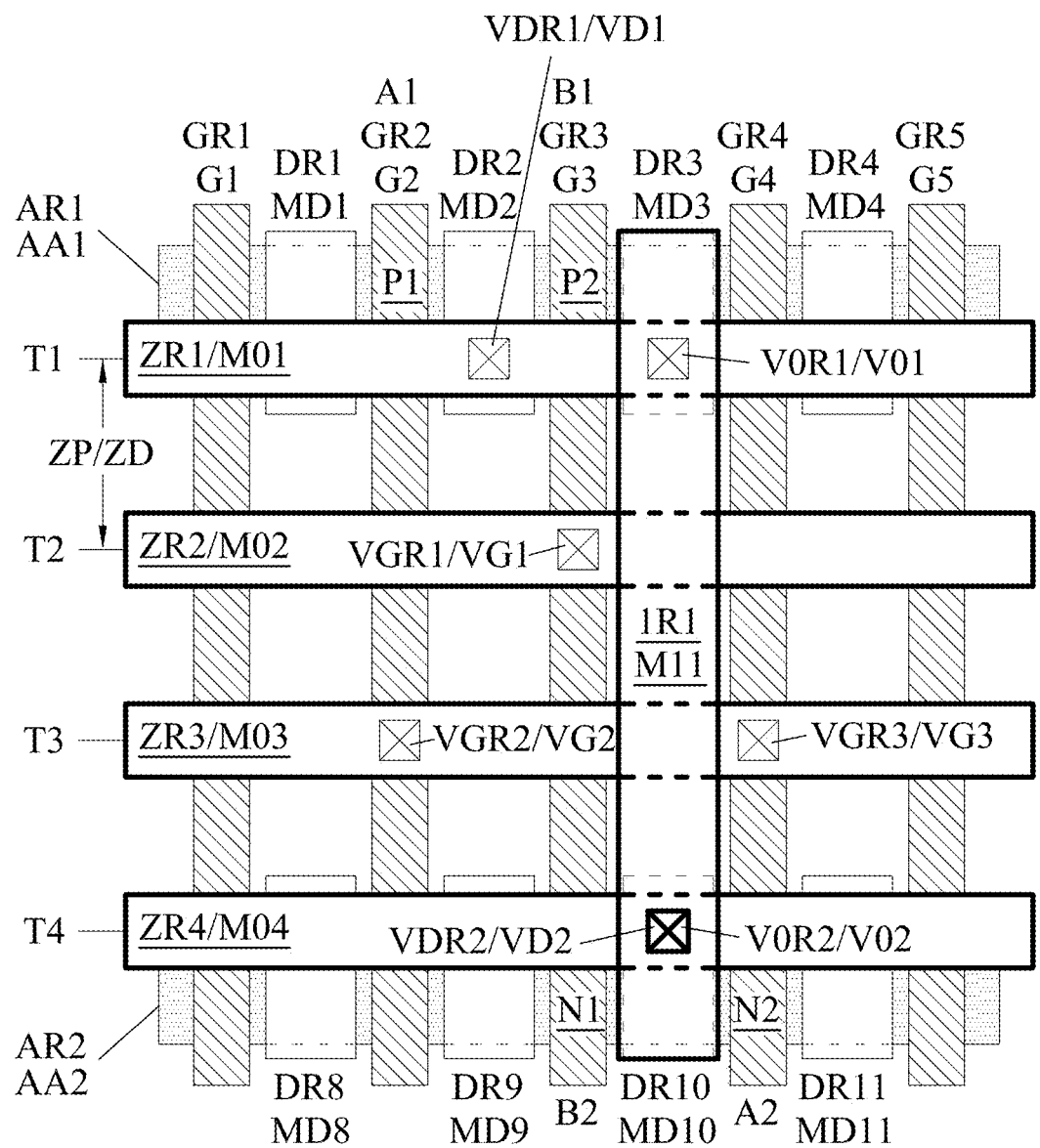
FIG. 2 is a diagram of an IC layout diagram and an IC structure, in accordance with some embodiments.

FIG. 2 is a diagram of IC layout diagram 200A and IC structure 200B, in accordance with some embodiments. IC layout diagram 200A includes MD regions DR1-DR4 and DR8-DR11, gate regions GR1-GR5, metal one region 1R1, and via regions VDR1, VDR2, VGR1-VGR3, V0R1, and V0R2. Correspondingly, IC structure 200B includes MD segments MD1-MD4 and MD8-MD11, gate structures G1-G5, metal one segment M11, and via structures VD1, VD2, VG1-VG3, V01, and V02.

Each of MD regions DR1-DR4 overlaps active region AR1 such that MD segments MD1-MD4 overlie active area AA1, and each of MD regions DR8-DR11 overlaps active region AR2 such that MD segments MD8-MD11 overlie active area AA2. Metal one region 1R1 intersects each of metal zero regions ZR1-ZR4 between gate regions GR3 and GR4 such that metal one segment M11 overlies each of metal zero segments M01-M04 between gate structures G3 and G4.

Via region VDR1 overlaps MD region DR2 and metal zero region ZR1 such that via structure VD1 electrically connects MD segment MD2 to metal zero segment M01, and via region VDR2 overlaps MD region DR10 and metal zero region ZR4 such that via structure VD2 electrically connects MD segment MD10 to metal zero segment M04. Via region VGR1 overlaps gate region GR3 and metal zero region ZR2 such that via structure VG1 electrically connects gate structure G3 to metal zero segment M02, via region VGR2 overlaps gate region GR2 and metal zero region ZR3 such that via structure VG2 electrically connects gate structure G2 to metal zero segment M03, and via region VGR3 overlaps gate region GR4 and metal zero region ZR3 such that via structure VG3 electrically connects gate structure G4 to metal zero segment M03. Via region V0R1 overlaps metal zero region ZR1 and metal one region 1R1 such that via structure V01 electrically connects metal zero segment M01 to metal one segment M11, and via region V0R2 overlaps metal zero region ZR4 and metal one region 1R1 such that via structure V02 electrically connects metal zero segment M04 to metal one segment M11.

The intersection of gate region GR2 and active region AR1 corresponds to transistor P1 including a portion of gate structure G2 equivalent to gate A1 and portions of active area AA1 underlying and adjacent to gate structure G2. The intersection of gate region GR3 and active region AR1 corresponds to transistor P2 including a portion of gate structure G3 equivalent to gate B1 and portions of active area AA1 underlying and adjacent to gate structure G3. The intersection of gate region GR3 and active region AR2 corresponds to transistor N1 including a portion of gate structure G3 equivalent to gate B2 and portions of active area AA2 underlying and adjacent to gate structure G3. The intersection of gate region GR4 and active region AR2 corresponds to transistor N2 including a portion of gate structure G4 equivalent to gate A2 and portions of active area AA2 underlying and adjacent to gate structure G4.

IC structure 200B based on IC layout diagram 200A thereby includes conductive path PA between gates A1 and A2 including gate structure G2, via structure VG2, metal zero segment M03, via structure VG3, and gate structure G4; conductive path PB between gates B1 and B2 including gate structure G3; and conductive path PC including MD segment MD2 (overlying the portion of active area AA1 shared by transistors P1 and P2), via structure VD1, metal zero segment M01, via structure V01, metal one segment M11, via structure V02, metal zero segment M04, via structure VD2, and MD segment MD10 (overlying the portion of active area AA2 shared by transistors N1 and N2).

Figure 3:
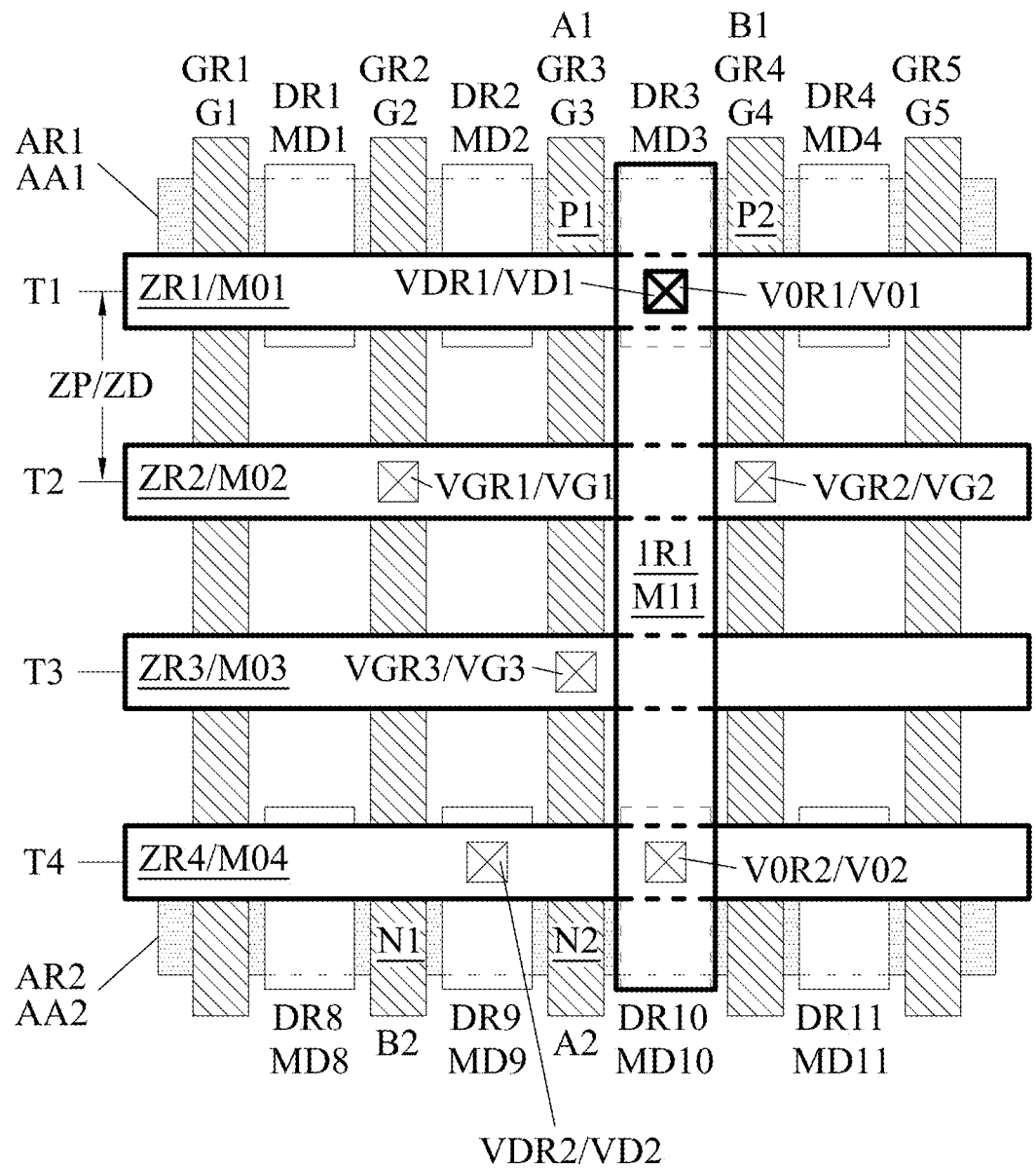
FIG. 3 is a diagram of an IC layout diagram and an IC structure, in accordance with some embodiments.

FIG. 3 is a diagram of IC layout diagram 300A and IC structure 300B, in accordance with some embodiments. IC layout diagram 300A includes MD regions DR1-DR4 and DR8-DR11, gate regions GR1-GR5, metal one region 1R1, and via regions VDR1, VDR2, VGR1-VGR3, V0R1, and VDR2. Correspondingly, IC structure 300B includes MD segments MD1-MD4 and MD8-MD11, gate structures G1-G5, metal one segment M11, and via structures VD1, VD2, VG1-VG3, V01, and V02.

Each of MD regions DR1-DR4 overlaps active region AR1 such that MD segments MD1-MD4 overlie active area AA1, and each of MD regions DR8-DR11 overlaps active region AR2 such that MD segments MD8-MD11 overlie active area AA2. Metal one region 1R1 intersects each of metal zero regions ZR1-ZR4 between gate regions GR3 and GR4 such that metal one segment M11 overlies each of metal zero segments M01-M04 between gate structures G3 and G4.

Via region VDR1 overlaps MD region DR3 and metal zero region ZR1 such that via structure VD1 electrically connects MD segment MD3 to metal zero segment M01, and via region VDR2 overlaps MD region DR9 and metal zero region ZR4 such that via structure VD2 electrically connects MD segment MD9 to metal zero segment M04. Via region VGR1 overlaps gate region GR2 and metal zero region ZR2 such that via structure VG1 electrically connects gate structure G2 to metal zero segment M02, via region VGR2 overlaps gate region GR4 and metal zero region ZR2 such that via structure VG2 electrically connects gate structure G4 to metal zero segment M02, and via region VGR3 overlaps gate region GR3 and metal zero region ZR3 such that via structure VG3 electrically connects gate structure G3 to metal zero segment M03. Via region V0R1 overlaps metal zero region ZR1 and metal one region 1R1 such that via structure V01 electrically connects metal zero segment M01 to metal one segment M11, and via region V0R2 overlaps metal zero region ZR4 and metal one region 1R1 such that via structure V02 electrically connects metal zero segment M04 to metal one segment Ml.

The intersection of gate region GR3 and active region AR1 corresponds to transistor P1 including a portion of gate structure G3 equivalent to gate A1 and portions of active area AA1 underlying and adjacent to gate structure G3. The intersection of gate region GR4 and active region AR1 corresponds to transistor P2 including a portion of gate structure G4 equivalent to gate B1 and portions of active area AA1 underlying and adjacent to gate structure G4. The intersection of gate region GR2 and active region AR2 corresponds to transistor N1 including a portion of gate structure G2 equivalent to gate B2 and portions of active area AA2 underlying and adjacent to gate structure G2. The intersection of gate region GR3 and active region AR2 corresponds to transistor N2 including a portion of gate structure G3 equivalent to gate A2 and portions of active area AA2 underlying and adjacent to gate structure G3.

IC structure 300B based on IC layout diagram 300A thereby includes conductive path PA between gates A1 and A2 including gate structure G3; conductive path PB between gates B1 and B2 including gate structure G4, via structure VG2, metal zero segment M02, via structure VG1, and gate structure G2; and conductive path PC including MD segment MD3 (overlying the portion of active area AA1 shared by transistors P1 and P2), via structure VD1, metal zero segment M01, via structure V01, metal one segment M11, via structure V02, metal zero segment M04, via structure VD2, and MD segment MD9 (overlying the portion of active area AA2 shared by transistors N1 and N2).

Figure 4:
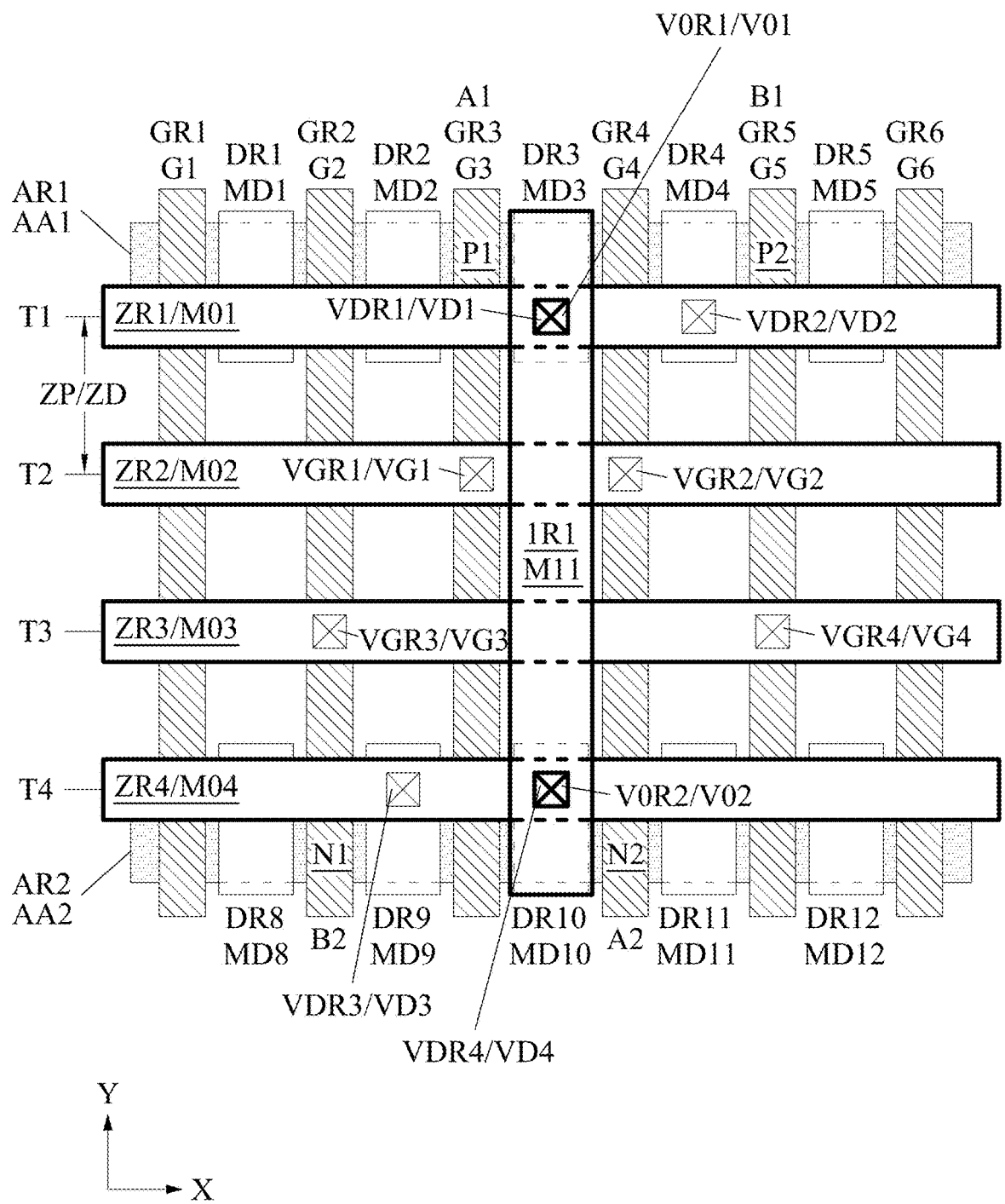
FIG. 4 is a diagram of an IC layout diagram and an IC structure, in accordance with some embodiments.

FIG. 4 is a diagram of IC layout diagram 400A and IC structure 400B, in accordance with some embodiments. IC layout diagram 400A includes MD regions DR1-DR5 and DR8-DR12, gate regions GR1-GR6, metal one region 1R1, and via regions VDR1-VDR4, VGR1-VGR4, V0R1, and V0R2. Correspondingly, IC structure 400B includes MD segments MD1-MD5 and MD8-MD12, gate structures G1-G6, metal one segment M11, and via structures VD1-VD4, VG1-VG4, V01, and V02.

Each of MD regions DR1-DR5 overlaps active region AR1 such that MD segments MD1-MD5 overlie active area AA1, and each of MD regions DR8-DR12 overlaps active region AR2 such that MD segments MD8-MD12 overlie active area AA2. Metal one region 1R1 intersects each of metal zero regions ZR1-ZR4 between gate regions GR3 and GR4 such that metal one segment M11 overlies each of metal zero segments M01-M04 between gate structures G3 and G4.

Via region VDR1 overlaps MD region DR3 and metal zero region ZR1 such that via structure VD1 electrically connects MD segment MD3 to metal zero segment M01, via region VDR2 overlaps MD region DR4 and metal zero region ZR1 such that via structure VD2 electrically connects MD segment MD4 to metal zero segment M01, via region VDR3 overlaps MD region DR9 and metal zero region ZR4 such that via structure VD3 electrically connects MD segment MD9 to metal zero segment M04, and via region VDR4 overlaps MD region DR10 and metal zero region ZR4 such that via structure VD4 electrically connects MD segment MD10 to metal zero segment M04. Via region VGR1 overlaps gate region GR3 and metal zero region ZR2 such that via structure VG1 electrically connects gate structure G3 to metal zero segment M02, via region VGR2 overlaps gate region GR4 and metal zero region ZR2 such that via structure VG2 electrically connects gate structure G4 to metal zero segment M02, via region VGR3 overlaps gate region GR2 and metal zero region ZR3 such that via structure VG3 electrically connects gate structure G2 to metal zero segment M03, and via region VGR4 overlaps gate region GR5 and metal zero region ZR3 such that via structure VG4 electrically connects gate structure G5 to metal zero segment M03. Via region V0R1 overlaps metal zero region ZR1 and metal one region 1R1 such that via structure V01 electrically connects metal zero segment M01 to metal one segment M11, and via region VGR2 overlaps metal zero region ZR4 and metal one region 1R1 such that via structure V02 electrically connects metal zero segment M04 to metal one segment M11.

The intersection of gate region GR3 and active region AR1 corresponds to transistor P1 including a portion of gate structure G3 equivalent to gate A1 and portions of active area AA1 underlying and adjacent to gate structure G3. The intersection of gate region GR5 and active region AR1 corresponds to transistor P2 including a portion of gate structure G5 equivalent to gate B1 and portions of active area AA1 underlying and adjacent to gate structure G5. The intersection of gate region GR2 and active region AR2 corresponds to transistor N1 including a portion of gate structure G2 equivalent to gate B2 and portions of active area AA2 underlying and adjacent to gate structure G2. The intersection of gate region GR4 and active region AR2 corresponds to transistor N2 including a portion of gate structure G4 equivalent to gate A2 and portions of active area AA2 underlying and adjacent to gate structure G4.

IC structure 400B based on IC layout diagram 400A thereby includes conductive path PA between gates A1 and A2 including gate structure G3, via structure VG1, metal zero segment M02, via structure VG2, and gate structure G4; conductive path PB between gates B1 and B2 including gate structure G5, via structure VG4, metal zero segment M03, via structure VG3, and gate structure G2; and conductive path PC including MD segment MD3 (overlying a portion of active area AA1 included in transistor P1), via structure VD1, MD segment MD4 (overlying a portion of active area AA1 included in transistor P2), via structure VD2, metal zero segment M01, via structure V01, metal one segment M11, via structure V02, metal zero segment M04, via structure VD3, MD segment MD9 (overlying a portion of active area AA2 included in transistor N1), via structure VD4, and MD segment MD10 (overlying a portion of active area AA2 included in transistor N2).

Figure 5:
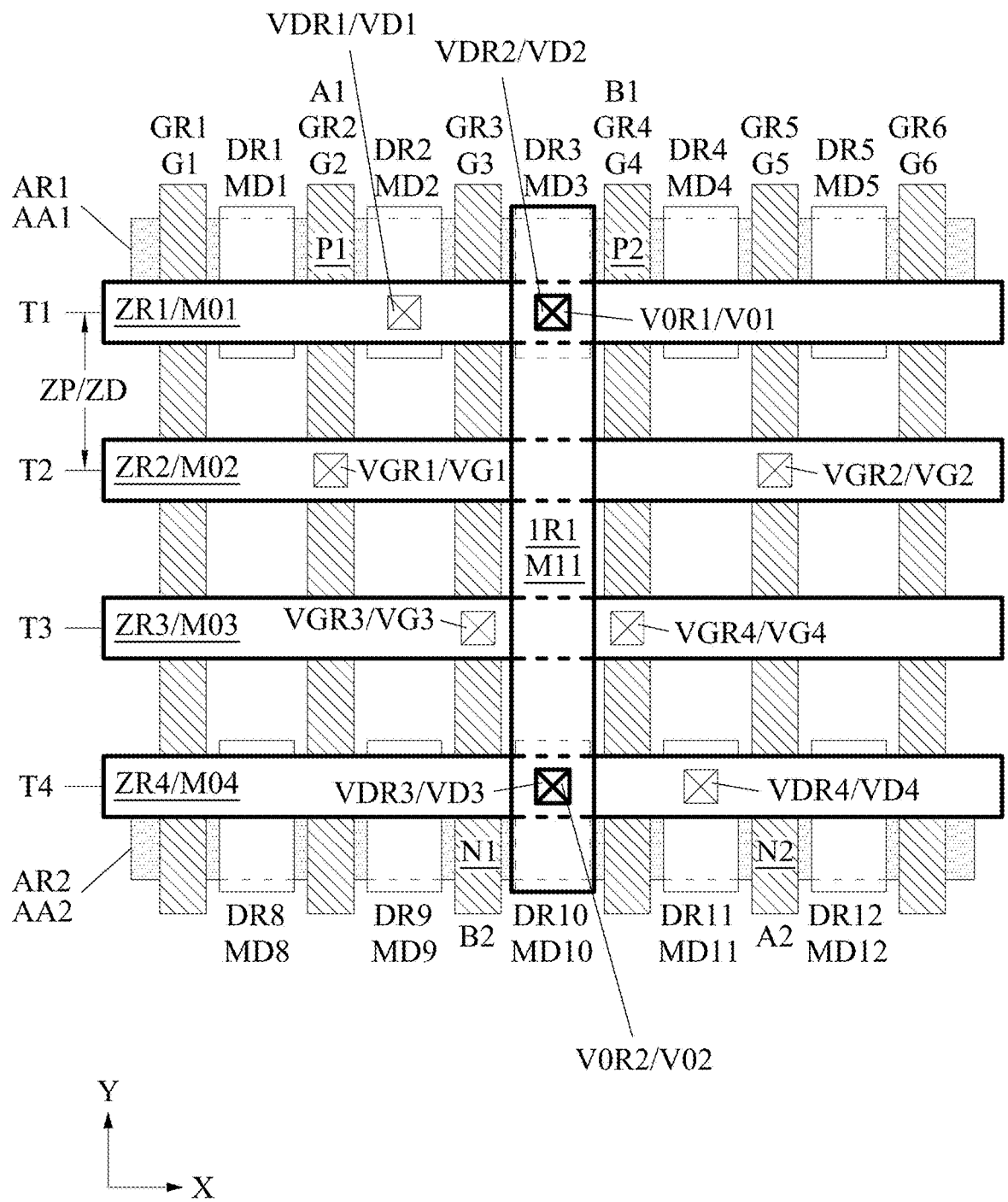
FIG. 5 is a diagram of an IC layout diagram and an IC structure, in accordance with some embodiments.

FIG. 5 is a diagram of IC layout diagram 500A and IC structure 500B, in accordance with some embodiments. IC layout diagram 500A includes MD regions DR1-DR5 and DR8-DR12, gate regions GR1-GR6, metal one region 1R1, and via regions VDR1-VDR4, VGR1-VGR4, V0R1, and V0R2. Correspondingly, IC structure 500B includes MD segments MD1-MD5 and MD8-MD12, gate structures G1-G6, metal one segment M11, and via structures VD1-VD4, VG1-VG4, V01, and V02.

Each of MD regions DR1-DR5 overlaps active region AR1 such that MD segments MD1-MD5 overlie active area AA1, and each of MD regions DR8-DR12 overlaps active region AR2 such that MD segments MD8-MD12 overlie active area AA2. Metal one region 1R1 intersects each of metal zero regions ZR1-ZR4 between gate regions GR3 and GR4 such that metal one segment M11 overlies each of metal zero segments M01-M04 between gate structures G3 and G4.

Via region VDR1 overlaps MD region DR2 and metal zero region ZR1 such that via structure VD1 electrically connects MD segment MD2 to metal zero segment M01, via region VDR2 overlaps MD region DR3 and metal zero region ZR1 such that via structure VD2 electrically connects MD segment MD3 to metal zero segment M01, via region VDR3 overlaps MD region DR10 and metal zero region ZR4 such that via structure VD3 electrically connects MD segment MD10 to metal zero segment M04, and via region VDR4 overlaps MD region DR11 and metal zero region ZR4 such that via structure VD4 electrically connects MD segment MD11 to metal zero segment M04. Via region VGR1 overlaps gate region GR2 and metal zero region ZR2 such that via structure VG1 electrically connects gate structure G2 to metal zero segment M02, via region VGR2 overlaps gate region GR5 and metal zero region ZR2 such that via structure VG2 electrically connects gate structure G5 to metal zero segment M02, via region VGR3 overlaps gate region GR3 and metal zero region ZR3 such that via structure VG3 electrically connects gate structure G3 to metal zero segment M03, and via region VGR4 overlaps gate region GR4 and metal zero region ZR3 such that via structure VG4 electrically connects gate structure G4 to metal zero segment M03. Via region V0R1 overlaps metal zero region ZR1 and metal one region 1R1 such that via structure V01 electrically connects metal zero segment M01 to metal one segment M11, and via region VGR2 overlaps metal zero region ZR4 and metal one region 1R1 such that via structure V02 electrically connects metal zero segment M04 to metal one segment M11.

The intersection of gate region GR2 and active region AR1 corresponds to transistor P1 including a portion of gate structure G2 equivalent to gate A1 and portions of active area AA1 underlying and adjacent to gate structure G2. The intersection of gate region GR4 and active region AR1 corresponds to transistor P2 including a portion of gate structure G4 equivalent to gate B1 and portions of active area AA1 underlying and adjacent to gate structure G4. The intersection of gate region GR3 and active region AR2 corresponds to transistor N1 including a portion of gate structure G3 equivalent to gate B2 and portions of active area AA2 underlying and adjacent to gate structure G3. The intersection of gate region GR5 and active region AR2 corresponds to transistor N2 including a portion of gate structure G5 equivalent to gate A2 and portions of active area AA2 underlying and adjacent to gate structure G5.

IC structure 500B based on IC layout diagram 500A thereby includes conductive path PA between gates A1 and A2 including gate structure G2, via structure VG1, metal zero segment M02, via structure VG2, and gate structure G5; conductive path PB between gates B1 and B2 including gate structure G4, via structure VG4, metal zero segment M03, via structure VG3, and gate structure G3; and conductive path PC including MD segment MD2 (overlying a portion of active area AA1 included in transistor P1), via structure VD1, MD segment MD3 (overlying a portion of active area AA1 included in transistor P2), via structure VD2, metal zero segment M01, via structure V01, metal one segment M11, via structure V02, metal zero segment M04, via structure VD3, MD segment MD10 (overlying a portion of active area AA2 included in transistor N1), via structure VD4, and MD segment MD11 (overlying a portion of active area AA2 included in transistor N2).

Figure 6:
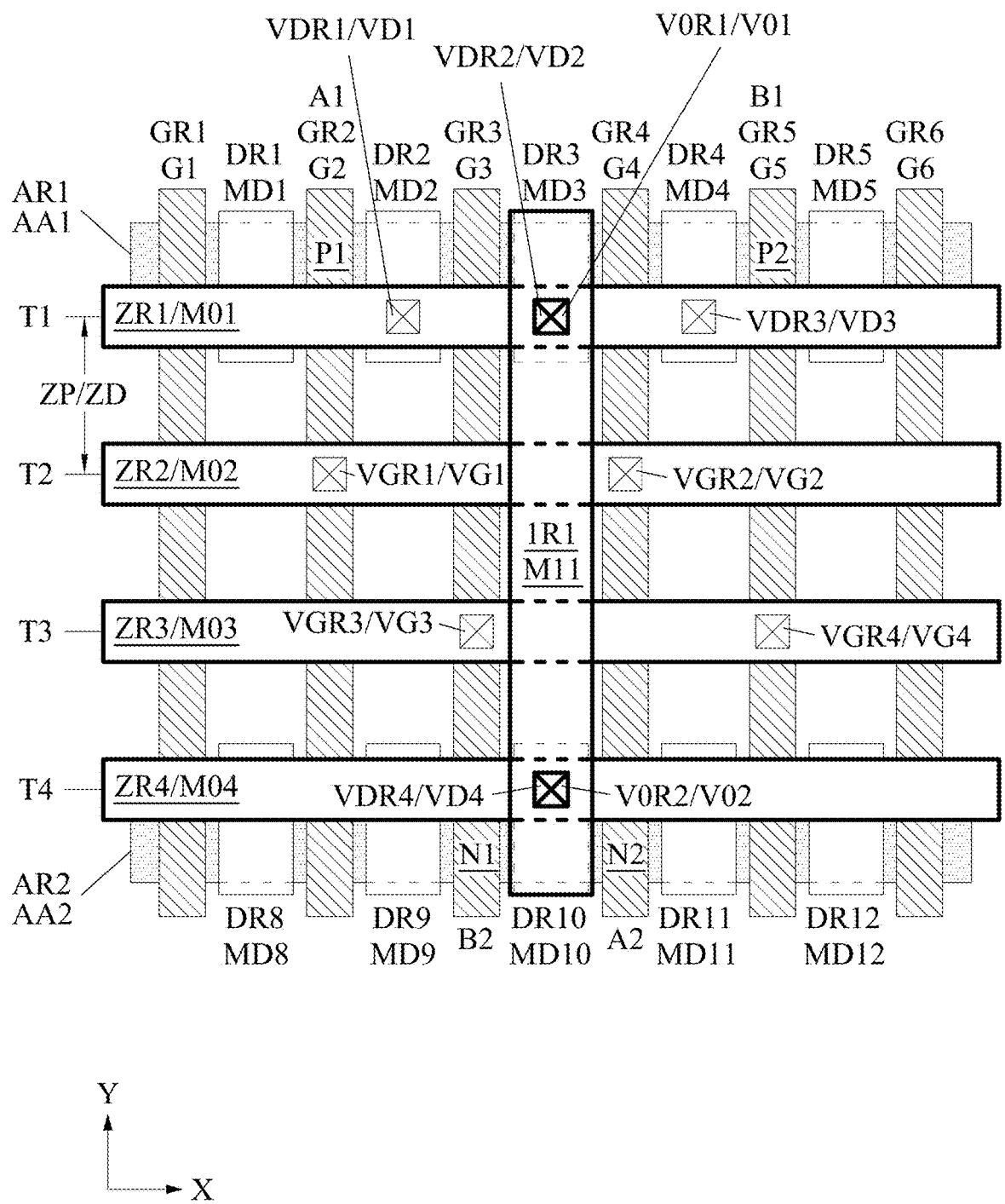
FIG. 6 is a diagram of an IC layout diagram and an IC structure, in accordance with some embodiments.

FIG. 6 is a diagram of IC layout diagram 600A and IC structure 600B, in accordance with some embodiments. IC layout diagram 600A includes MD regions DR1-DR5 and DR8-DR12, gate regions GR1-GR6, metal one region 1R1, and via regions VDR1-VDR4, VGR1-VGR4, V0R1, and V0R2. Correspondingly, IC structure 600B includes MD segments MD1-MD5 and MD8-MD12, gate structures G1-G6, metal one segment M11, and via structures VD1-VD4, VG1-VG4, V01, and V02.

Each of MD regions DR1-DR5 overlaps active region AR1 such that MD segments MD1-MD5 overlie active area AA1, and each of MD regions DR8-DR12 overlaps active region AR2 such that MD segments MD8-MD12 overlie active area AA2. Metal one region 1R1 intersects each of metal zero regions ZR1-ZR4 between gate regions GR3 and GR4 such that metal one segment M11 overlies each of metal zero segments M01-M04 between gate structures G3 and G4.

Via region VDR1 overlaps MD region DR2 and metal zero region ZR1 such that via structure VD1 electrically connects MD segment MD2 to metal zero segment M01, via region VDR2 overlaps MD region DR3 and metal zero region ZR1 such that via structure VD2 electrically connects MD segment MD3 to metal zero segment M01, via region VDR3 overlaps MD region DR4 and metal zero region ZR1 such that via structure VD3 electrically connects MD segment MD4 to metal zero segment M01, and via region VDR4 overlaps MD region DR10 and metal zero region ZR4 such that via structure VD4 electrically connects MD segment MD10 to metal zero segment M04. Via region VGR1 overlaps gate region GR2 and metal zero region ZR2 such that via structure VG1 electrically connects gate structure G2 to metal zero segment M02, via region VGR2 overlaps gate region GR4 and metal zero region ZR2 such that via structure VG2 electrically connects gate structure G4 to metal zero segment M02, via region VGR3 overlaps gate region GR3 and metal zero region ZR3 such that via structure VG3 electrically connects gate structure G3 to metal zero segment M03, and via region VGR4 overlaps gate region GR5 and metal zero region ZR3 such that via structure VG4 electrically connects gate structure G5 to metal zero segment M03. Via region V0R1 overlaps metal zero region ZR1 and metal one region 1R1 such that via structure V01 electrically connects metal zero segment M01 to metal one segment M11, and via region VGR2 overlaps metal zero region ZR4 and metal one region 1R1 such that via structure V02 electrically connects metal zero segment M04 to metal one segment M11.

The intersection of gate region GR2 and active region AR1 corresponds to transistor P1 including a portion of gate structure G2 equivalent to gate A1 and portions of active area AA1 underlying and adjacent to gate structure G2. The intersection of gate region GR5 and active region AR1 corresponds to transistor P2 including a portion of gate structure G5 equivalent to gate B1 and portions of active area AA1 underlying and adjacent to gate structure G5. The intersection of gate region GR3 and active region AR2 corresponds to transistor N1 including a portion of gate structure G3 equivalent to gate B2 and portions of active area AA2 underlying and adjacent to gate structure G3. The intersection of gate region GR4 and active region AR2 corresponds to transistor N2 including a portion of gate structure G4 equivalent to gate A2 and portions of active area AA2 underlying and adjacent to gate structure G4.

IC structure 600B based on IC layout diagram 600A thereby includes conductive path PA between gates A1 and A2 including gate structure G2, via structure VG1, metal zero segment M02, via structure VG2, and gate structure G4; conductive path PB between gates B1 and B2 including gate structure G5, via structure VG4, metal zero segment M03, via structure VG3, and gate structure G3; and conductive path PC including MD segment MD2 (overlying a portion of active area AA1 included in transistor P1), via structure VD1, MD segment MD3 (overlying an otherwise uncontrolled portion of active area AA1), via structure VD2, MD segment MD4 (overlying a portion of active area AA1 included in transistor P2), via structure VD2, metal zero segment M01, via structure V01, metal one segment M11, via structure V02, metal zero segment M04, via structure VD3, and MD segment MD10 (overlying the portion of active area AA2 shared by transistors N1 and N2).

Figure 7:
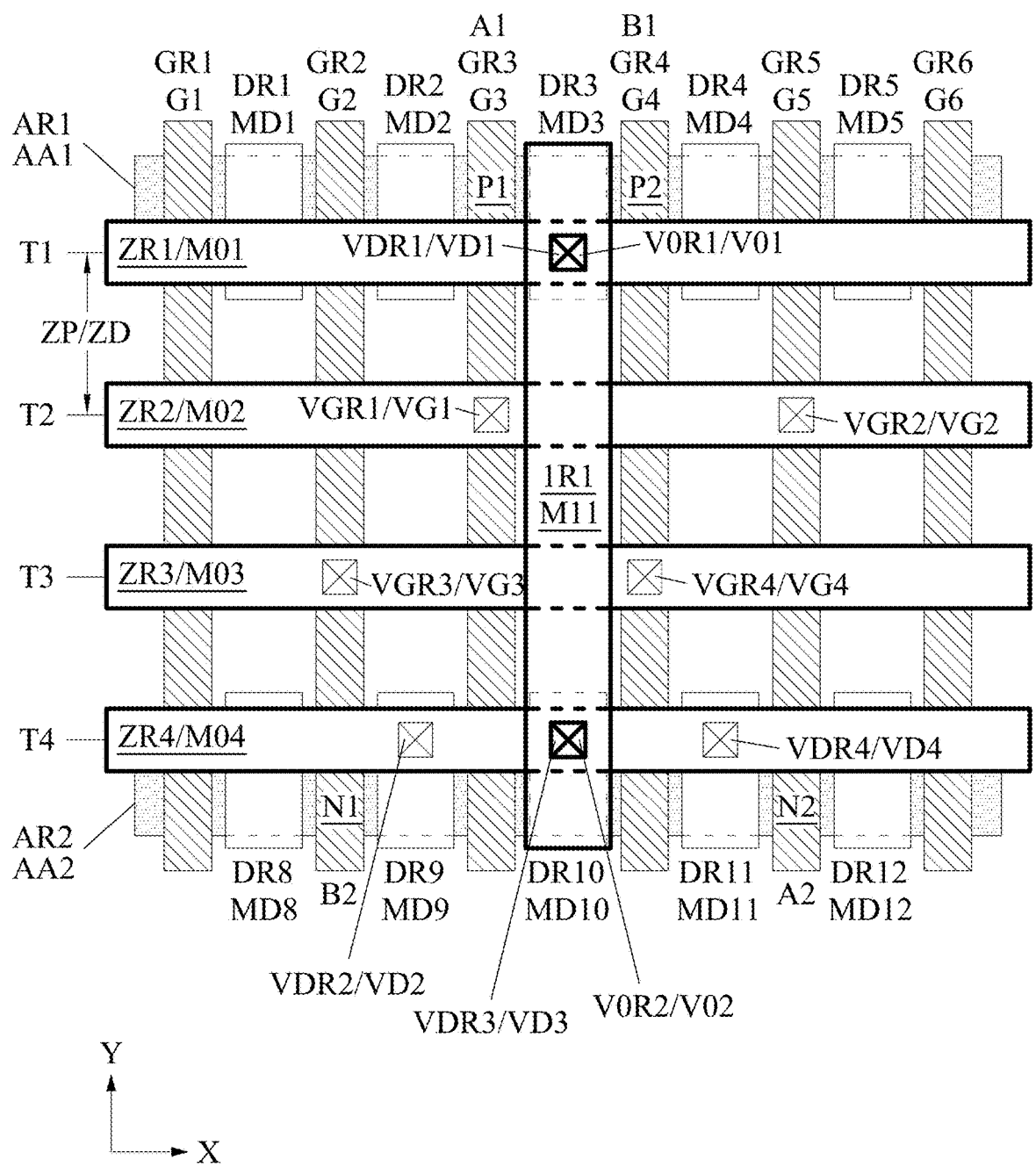
FIG. 7 is a diagram of an IC layout diagram and an IC structure, in accordance with some embodiments.

FIG. 7 is a diagram of IC layout diagram 700A and IC structure 700B, in accordance with some embodiments. IC layout diagram 700A includes MD regions DR1-DR5 and DR8-DR12, gate regions GR1-GR6, metal one region 1R1, and via regions VDR1-VDR4, VGR1-VGR4, V0R1, and V0R2. Correspondingly, IC structure 700B includes MD segments MD1-MD5 and MD8-MD12, gate structures G1-G6, metal one segment M11, and via structures VD1-VD4, VG1-VG4, V01, and V02.

Each of MD regions DR1-DR5 overlaps active region AR1 such that MD segments MD1-MD5 overlie active area AA1, and each of MD regions DR8-DR12 overlaps active region AR2 such that MD segments MD8-MD12 overlie active area AA2. Metal one region 1R1 intersects each of metal zero regions ZR1-ZR4 between gate regions GR3 and GR4 such that metal one segment M11 overlies each of metal zero segments M01-M04 between gate structures G3 and G4.

Via region VDR1 overlaps MD region DR3 and metal zero region ZR1 such that via structure VD1 electrically connects MD segment MD3 to metal zero segment M01, via region VDR2 overlaps MD region DR9 and metal zero region ZR4 such that via structure VD2 electrically connects MD segment MD9 to metal zero segment M04, via region VDR3 overlaps MD region DR10 and metal zero region ZR4 such that via structure VD3 electrically connects MD segment MD10 to metal zero segment M04, and via region VDR4 overlaps MD region DR11 and metal zero region ZR4 such that via structure VD4 electrically connects MD segment MD11 to metal zero segment M04. Via region VGR1 overlaps gate region GR3 and metal zero region ZR2 such that via structure VG1 electrically connects gate structure G3 to metal zero segment M02, via region VGR2 overlaps gate region GR5 and metal zero region ZR2 such that via structure VG2 electrically connects gate structure G5 to metal zero segment M02, via region VGR3 overlaps gate region GR2 and metal zero region ZR3 such that via structure VG3 electrically connects gate structure G2 to metal zero segment M03, and via region VGR4 overlaps gate region GR4 and metal zero region ZR3 such that via structure VG4 electrically connects gate structure G4 to metal zero segment M03. Via region V0R1 overlaps metal zero region ZR1 and metal one region 1R1 such that via structure V01 electrically connects metal zero segment M01 to metal one segment M11, and via region VGR2 overlaps metal zero region ZR4 and metal one region 1R1 such that via structure V02 electrically connects metal zero segment M04 to metal one segment M11.

The intersection of gate region GR3 and active region AR1 corresponds to transistor P1 including a portion of gate structure G3 equivalent to gate A1 and portions of active area AA1 underlying and adjacent to gate structure G3. The intersection of gate region GR4 and active region AR1 corresponds to transistor P2 including a portion of gate structure G4 equivalent to gate B1 and portions of active area AA1 underlying and adjacent to gate structure G4. The intersection of gate region GR2 and active region AR2 corresponds to transistor N1 including a portion of gate structure G2 equivalent to gate B2 and portions of active area AA2 underlying and adjacent to gate structure G2. The intersection of gate region GR5 and active region AR2 corresponds to transistor N2 including a portion of gate structure G5 equivalent to gate A2 and portions of active area AA2 underlying and adjacent to gate structure G5.

IC structure 700B based on IC layout diagram 700A thereby includes conductive path PA between gates A1 and A2 including gate structure G3, via structure VG1, metal zero segment M02, via structure VG2, and gate structure G5; conductive path PB between gates B1 and B2 including gate structure G4, via structure VG4, metal zero segment M03, via structure VG3, and gate structure G2; and conductive path PC including MD segment MD3 (overlying the portion of active area AA1 shared by transistors P1 and P2), via structure VD1, metal zero segment M01, via structure V01, metal one segment M11, via structure V02, metal zero segment M04, via structure VD2, MD segment MD9 (overlying a portion of active area AA2 included in transistor N1, via structure VD3, MD segment MD10 (overlying an otherwise uncontrolled portion of active area AA2), via structure VD4, and MD segment MD11 (overlying a portion of active area AA2 included in transistor N2).

Figure 8:
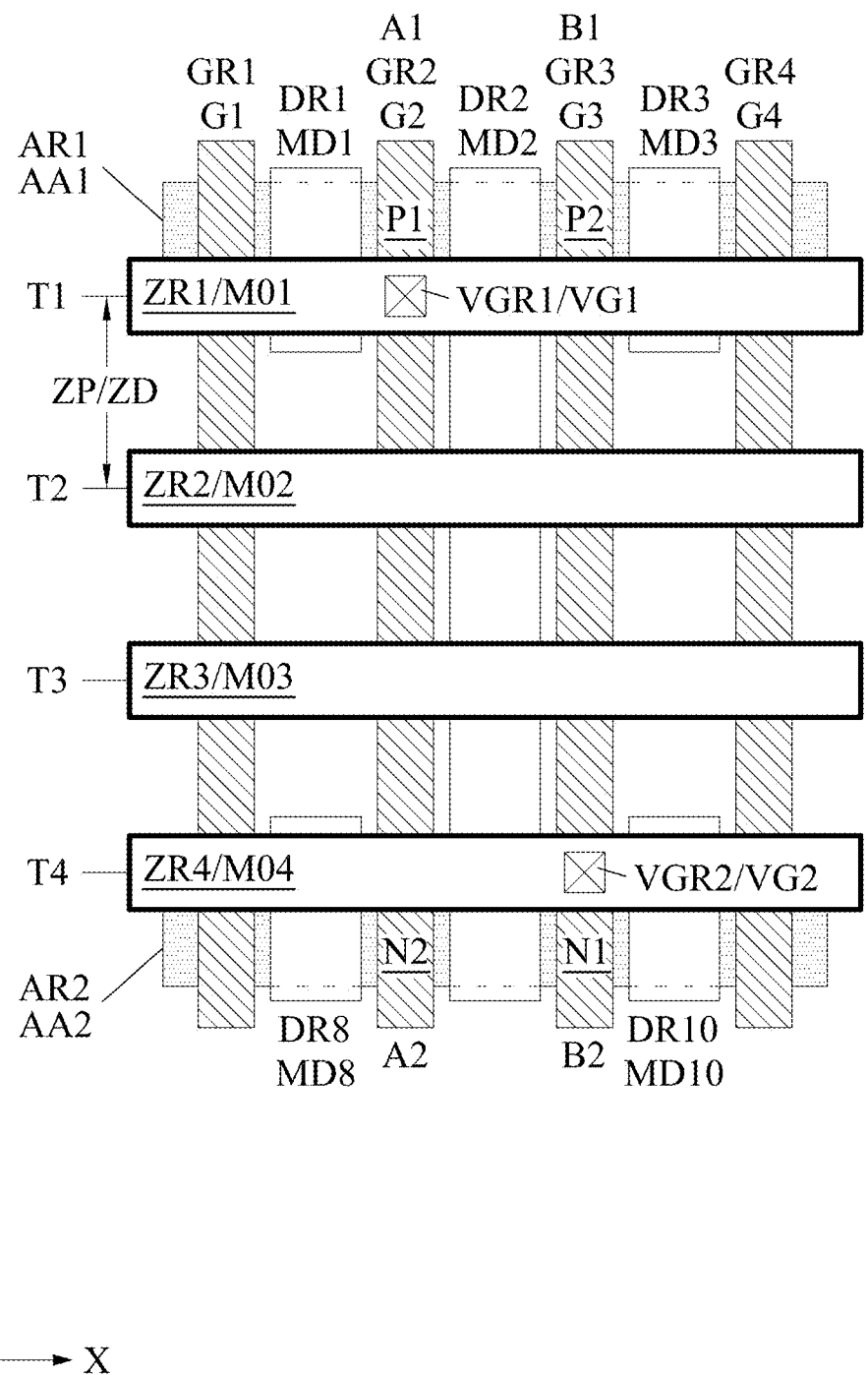
FIG. 8 is a diagram of an IC layout diagram and an IC structure, in accordance with some embodiments.

FIG. 8 is a diagram of IC layout diagram 800A and IC structure 800B, in accordance with some embodiments. IC layout diagram 800A includes MD regions DR1-DR3, DR8, and DR10, gate regions GR1-GR4, and via regions VGR1 and VGR2. Correspondingly, IC structure 700B includes MD segments MD1-MD3, MD8, and MD10, gate structures G1-G4, and via structures VG1 and VG2.

Each of MD regions DR1 and DR3 overlaps active region AR1 such that MD segments MD1 and MD3 overlie active area AA1, MD region MD2 overlaps active regions AR1 and AR2 such that MD segment MD2 overlies active areas AA1 and AA2, and each of MD regions DR8 and DR10 overlaps active region AR2 such that MD segments MD8 and MD10 overlie active area AA2. Via region VGR1 overlaps gate region GR2 and metal zero region ZR1 such that via structure VG1 electrically connects gate structure G2 to metal zero segment M01, and via region VGR2 overlaps gate region GR3 and metal zero region ZR4 such that via structure VG2 electrically connects gate structure G3 to metal zero segment M04.

The intersection of gate region GR2 and active region AR1 corresponds to transistor P1 including a portion of gate structure G2 equivalent to gate A1 and portions of active area AA1 underlying and adjacent to gate structure G2. The intersection of gate region GR3 and active region AR1 corresponds to transistor P2 including a portion of gate structure G3 equivalent to gate B1 and portions of active area AA1 underlying and adjacent to gate structure G3. The intersection of gate region GR3 and active region AR2 corresponds to transistor N1 including a portion of gate structure G3 equivalent to gate B2 and portions of active area AA2 underlying and adjacent to gate structure G3. The intersection of gate region GR2 and active region AR2 corresponds to transistor N2 including a portion of gate structure G2 equivalent to gate A2 and portions of active area AA2 underlying and adjacent to gate structure G2.

IC structure 800B based on IC layout diagram 800A thereby includes conductive path PA between gates A1 and A2 including gate structure G2; conductive path PB between gates B1 and B2 including gate structure G3; and conductive path PC including MD segment MD2 (overlying the portion of active area AA1 shared by transistors P1 and P2 and the portion of active area AA2 shared by transistors N1 and N2).

Figure 9:
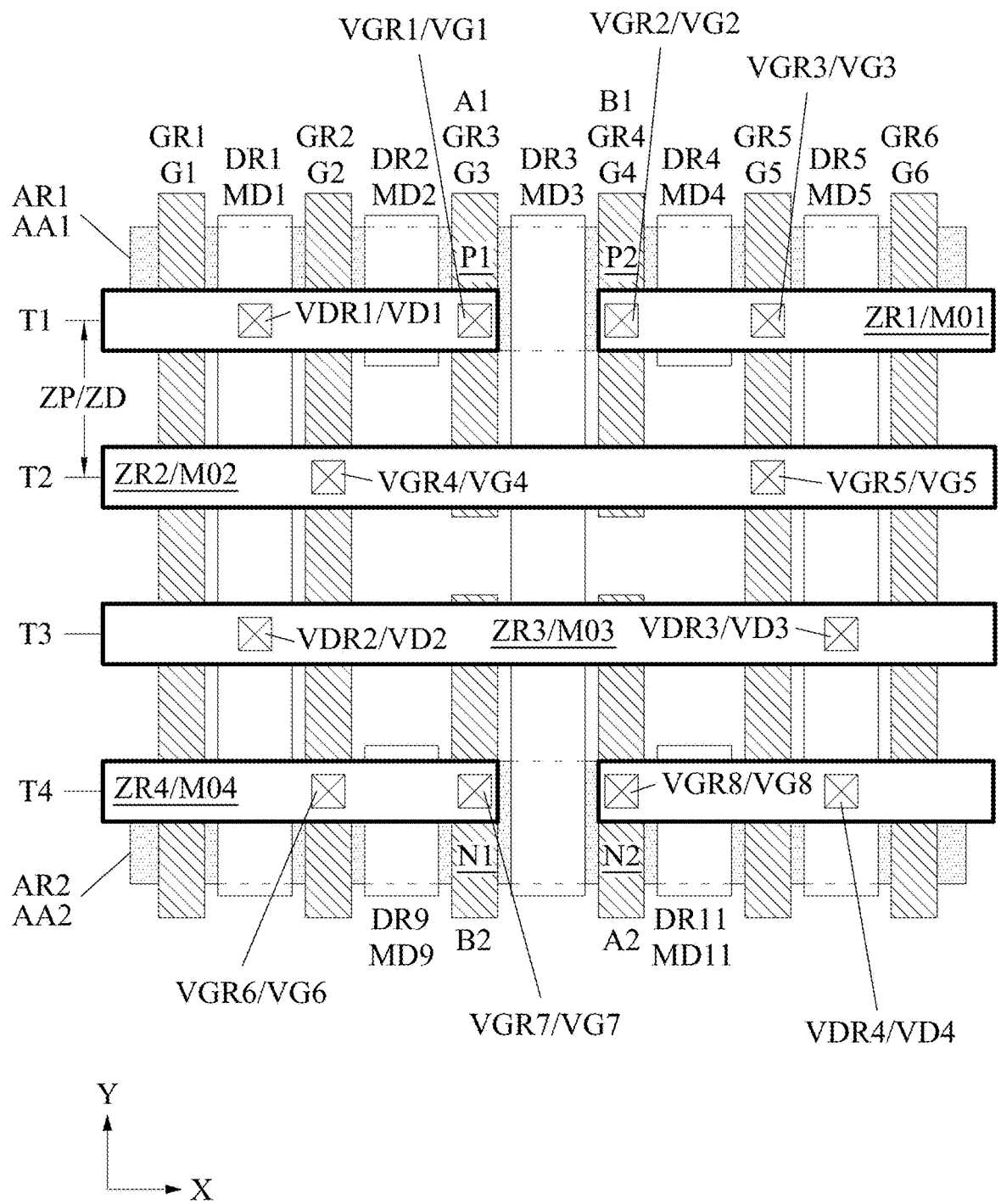
FIG. 9 is a diagram of an IC layout diagram and an IC structure, in accordance with some embodiments.

FIG. 9 is a diagram of IC layout diagram 900A and IC structure 900B, in accordance with some embodiments. IC layout diagram 900A includes MD regions DR1-DR5, DR9, and DR11, gate regions GR1-GR6, and via regions VDR1-VDR4 and VGR1-VGR8. Correspondingly, IC structure 900B includes MD segments MD1-MD5, MD9, and MD11, gate structures G1-G6, and via structures VD1-VD4 and VG1-VG8.

Each of MD regions DR1, DR3, and DR5 overlaps active regions AR1 and AR2 such that MD segments MD1, MD3, and MD5 overlie active areas AA1 and AA2, each of MD regions DR2 and DR4 overlaps active region AR1 such that MD segments MD2 and MD4 overlie active area AA1, and each of MD regions DR9 and DR11 overlaps active region AR2 such that MD segments MD9 and MD11 overlie active area AA2. Each of gate regions GR3 and GR4 includes a gap, otherwise referred to as a cut poly region in some embodiments, between metal zero regions ZR2 and ZR3 such that each of gate structures G3 and G4 includes a nonconductive discontinuity between metal zero segments M02 and M03. Each of metal zero regions ZR1 and ZR4 includes a gap, otherwise referred to as a cut metal zero region in some embodiments, between gate regions GR3 and GR4 such that each of metal zero segments M01 and M04 includes a plurality of segments separated by a nonconductive discontinuity between gate structures G3 and G4.

Via region VDR1 overlaps MD region DR1 and metal zero region ZR1 such that via structure VD1 electrically connects MD segment MD1 to metal zero segment M01, via region VDR2 overlaps MD region DR1 and metal zero region ZR3 such that via structure VD2 electrically connects MD segment MD1 to metal zero segment M03, via region VDR3 overlaps MD region DR5 and metal zero region ZR3 such that via structure VD3 electrically connects MD segment MD5 to metal zero segment M03, and via region VDR4 overlaps MD region DR5 and metal zero region ZR4 such that via structure VD4 electrically connects MD segment MD5 to metal zero segment M04. Via region VGR1 overlaps gate region GR3 and metal zero region ZR1 such that via structure VG1 electrically connects gate structure G3 to metal zero segment M01, via region VGR2 overlaps gate region GR4 and metal zero region ZR1 such that via structure VG2 electrically connects gate structure G4 to metal zero segment M01, via region VGR3 overlaps gate region GR5 and metal zero region ZR1 such that via structure VG3 electrically connects gate structure G5 to metal zero segment M01, via region VGR4 overlaps gate region GR2 and metal zero region ZR2 such that via structure VG4 electrically connects gate structure G2 to metal zero segment M02, via region VGR5 overlaps gate region GR5 and metal zero region ZR2 such that via structure VG5 electrically connects gate structure G5 to metal zero segment M02, via region VGR6 overlaps gate region GR2 and metal zero region ZR4 such that via structure VG6 electrically connects gate structure G2 to metal zero segment M04, via region VGR7 overlaps gate region GR3 and metal zero region ZR4 such that via structure VG7 electrically connects gate structure G3 to metal zero segment M04, and via region VGR8 overlaps gate region GR4 and metal zero region ZR4 such that via structure VG8 electrically connects gate structure G4 to metal zero segment M04.

The intersection of gate region GR3 and active region AR1 corresponds to transistor P1 including a portion of gate structure G3 equivalent to gate A1 and portions of active area AA1 underlying and adjacent to gate structure G3. The intersection of gate region GR4 and active region AR1 corresponds to transistor P2 including a portion of gate structure G4 equivalent to gate B1 and portions of active area AA1 underlying and adjacent to gate structure G4. The intersection of gate region GR3 and active region AR2 corresponds to transistor N1 including a portion of gate structure G3 equivalent to gate B2 and portions of active area AA2 underlying and adjacent to gate structure G3. The intersection of gate region GR4 and active region AR2 corresponds to transistor N2 including a portion of gate structure G4 equivalent to gate A2 and portions of active area AA2 underlying and adjacent to gate structure G4.

IC structure 900B based on IC layout diagram 900A thereby includes conductive path PA between gates A1 and A2 including via structure VG1, metal zero segment M01, via structure VD1, MD segment MD1, via structure VD2, metal zero segment M03, via structure VD3, MD segment MD5, via structure VD4, metal segment M04, and via structure VG8; conductive path PB between gates B1 and B2 including via structure VG2, metal zero segment M01, via structure VG3, gate structure G5, via structure VG5, metal zero segment M02, via structure VG4, gate structure G2, via structure VG6, metal zero segment M04, and via structure VG7; and conductive path PC including MD segment MD3 (overlying the portion of active area AA1 shared by transistors P1 and P2 and the portion of active area AA2 shared by transistors N1 and N2).

FIG. 10 is a diagram of IC layout diagram 1000A and IC structure 1000B, in accordance with some embodiments. IC layout diagram 1000A includes MD regions DR1-DR7, DR9, DR10, DR12, and DR13, gate regions GR1-GR8, metal one regions 1R1 and 1R2, metal two region 2R1, and via regions VGR1-VGR8, V0R1, V0R2, V1R1, and V1R2. Correspondingly, IC structure 1000B includes MD segments MD1-MD7, MD9, MD10, MD12, and MD13, gate structures G1-G8, metal one segments M11 and M12, metal two segment M21, and via structures VG1-VG8, V01, V02, V11, and V12.

Each of MD regions DR1, DR4, and DR7 overlaps active regions AR1 and AR2 such that MD segments MD1, MD4, and MD7 overlie active areas AA1 and AA2. Each of MD regions DR2, DR3, DR5, and DR6 overlaps active region AR1 such that MD segments MD2, MD3, MD5, and MD6 overlie active area AA1, and each of MD regions DR9, DR10, DR12, and DR13 overlaps active region AR2 such that MD segments MD9, MD10, MD12, and MD13 overlie active area AA2. Each of gate regions GR4 and GR5 includes a gap, otherwise referred to as a cut poly region in some embodiments, between metal zero regions ZR2 and ZR3 such that each of gate structures G4 and G5 includes a nonconductive discontinuity between metal zero segments M02 and M03. Each of metal zero regions ZR1 and ZR4 includes a gap, otherwise referred to as a cut metal zero region in some embodiments, between gate regions GR4 and GR5 such that each of metal zero segments M01 and M04 includes a plurality of segments separated by a nonconductive discontinuity between gate structures G4 and G5.

Metal one region 1R1 intersects each of metal zero regions ZR1-ZR4 between gate regions GR2 and GR3 such that metal one segment M11 overlies each of metal zero segments M01-M04 between gate structures G2 and G3, and metal one region 1R2 intersects each of metal zero regions ZR1-ZR4 between gate regions GR6 and GR7 such that metal one segment M12 overlies each of metal zero segments M01-M04 between gate structures G6 and G7. Metal two region 2R1 intersects each of metal one regions 1R1 and 1R2, and metal zero region ZR2 in some embodiments, between metal zero regions ZR1 and ZR3 such that metal two segment M21 overlies each of metal one segments M11 and M12, and metal zero segment M02 in some embodiments, between metal zero segment M01 and M03.

Via region VGR1 overlaps gate region GR3 and metal zero region ZR1 such that via structure VG1 electrically connects gate structure G3 to metal zero segment M01, via region VGR2 overlaps gate region GR4 and metal zero region ZR1 such that via structure VG2 electrically connects gate structure G4 to metal zero segment M01, via region VGR3 overlaps gate region GR5 and metal zero region ZR1 such that via structure VG3 electrically connects gate structure G5 to metal zero segment M01, via region VGR4 overlaps gate region GR3 and metal zero region ZR3 such that via structure VG4 electrically connects gate structure G3 to metal zero segment M03, via region VGR5 overlaps gate region GR6 and metal zero region ZR3 such that via structure VG5 electrically connects gate structure G6 to metal zero segment M03, via region VGR6 overlaps gate region GR4 and metal zero region ZR4 such that via structure VG6 electrically connects gate structure G4 to metal zero segment M04, via region VGR7 overlaps gate region GR5 and metal zero region ZR4 such that via structure VG7 electrically connects gate structure G5 to metal zero segment M04, and via region VGR8 overlaps gate region GR6 and metal zero region ZR4 such that via structure VG8 electrically connects gate structure G6 to metal zero segment M04.

Via region V0R1 overlaps metal zero region ZR1 and metal one region 1R2 such that via structure V01 electrically connects metal zero segment M01 to metal one segment M12, and via region V0R2 overlaps metal zero region ZR4 and metal one region 1R1 such that via structure V02 electrically connects metal zero segment M04 to metal one segment M11. Via region V1R1 overlaps metal one region 1R1 and metal two region 2R1 such that via structure V11 electrically connects metal one segment M11 to metal two segment M21, and via region V1R2 overlaps metal one region 1R2 and metal two region 2R1 such that via structure V12 electrically connects metal one segment M12 to metal two segment M21.

The intersection of gate region GR4 and active region AR1 corresponds to transistor P1 including a portion of gate structure G4 equivalent to gate A1 and portions of active area AA1 underlying and adjacent to gate structure G4. The intersection of gate region GR5 and active region AR1 corresponds to transistor P2 including a portion of gate structure G5 equivalent to gate B1 and portions of active area AA1 underlying and adjacent to gate structure G5. The intersection of gate region GR4 and active region AR2 corresponds to transistor N1 including a portion of gate structure G4 equivalent to gate B2 and portions of active area AA2 underlying and adjacent to gate structure G4. The intersection of gate region GR5 and active region AR2 corresponds to transistor N2 including a portion of gate structure G5 equivalent to gate A2 and portions of active area AA2 underlying and adjacent to gate structure G5.

IC structure 1000B based on IC layout diagram 1000A thereby includes conductive path PA between gates A1 and A2 including via structure VG2, metal zero segment M01, via structure VG1, gate structure G3, via structure VG4, metal zero segment M03, via structure VG5, gate structure G6, via structure VG8, metal zero segment M04, and via structure VG7; conductive path PB between gates B1 and B2 including via structure VG3, metal zero segment M01, via structure V01, metal one segment M12, via structure V12, metal two segment M21, via structure V11, metal one segment M11, via structure V02, metal zero segment M04, and via structure VG6; and conductive path PC including MD segment MD4 (overlying the portion of active area AA1 shared by transistors P1 and P2 and the portion of active area AA2 shared by transistors N1 and N2).

FIG. 11 is a diagram of IC layout diagram 1100A and IC structure 1100B, in accordance with some embodiments. IC layout diagram 1100A includes MD regions DR1-DR7, DR9, DR10, and DR12, gate regions GR1-GR8, metal one regions 1R1 and 1R2, metal two region 2R1, and via regions VDR1, VDR2, VGR1-VGR6, V0R1, V0R2, V1R1, and V1R2. Correspondingly, IC structure 1100B includes MD segments MD1-MD7, MD9, MD10, and MD12, gate structures G1-G8, metal one segments M11 and M12, metal two segment M21, and via structures VD1, VD2, VG1-VG6, V01, V02, V11, and V12.

Each of MD regions DR1, DR4, DR6, and DR7 overlaps active regions AR1 and AR2 such that MD segments MD1, MD4, MD6, and MD7 overlie active areas AA1 and AA2. Each of MD regions DR2, DR3, and DR5 overlaps active region AR1 such that MD segments MD2, MD3, and MD5 overlie active area AA1, and each of MD regions DR9, DR10, and DR12 overlaps active region AR2 such that MD segments MD9, MD10, and MD12 overlie active area AA2. Each of gate regions GR4 and GR5 includes a gap, otherwise referred to as a cut poly region in some embodiments, between metal zero regions ZR2 and ZR3 such that each of gate structures G4 and G5 includes a nonconductive discontinuity between metal zero segments M02 and M03. Each of metal zero regions ZR1 and ZR4 includes a gap, otherwise referred to as a cut metal zero region in some embodiments, between gate regions GR4 and GR5 such that each of metal zero segments M01 and M04 includes a plurality of segments separated by a nonconductive discontinuity between gate structures G4 and G5.

Metal one region 1R1 intersects each of metal zero regions ZR1-ZR4 between gate regions GR2 and GR3 such that metal one segment M11 overlies each of metal zero segments M01-M04 between gate structures G2 and G3, and metal one region 1R2 intersects each of metal zero regions ZR1-ZR4 between gate regions GR6 and GR7 such that metal one segment M12 overlies each of metal zero segments M01-M04 between gate structures G6 and G7. Metal two region 2R1 intersects each of metal one regions 1R1 and 1R2, and metal zero region ZR2 in some embodiments, between metal zero regions ZR1 and ZR3 such that metal two segment M21 overlies each of metal one segments M11 and M12, and metal zero segment M02 in some embodiments, between metal zero segment M01 and M03.

Via region VDR1 overlaps MD region DR6 and metal zero region ZR3 such that via structure VD1 electrically connects MD segment MD6 to metal zero segment M03, and via region VDR2 overlaps MD region DR6 and metal zero region ZR4 such that via structure VD2 electrically connects MD segment MD6 to metal zero segment M04. Via region VGR1 overlaps gate region GR3 and metal zero region ZR1 such that via structure VG1 electrically connects gate structure G3 to metal zero segment M01, via region VGR2 overlaps gate region GR4 and metal zero region ZR1 such that via structure VG2 electrically connects gate structure G4 to metal zero segment M01, via region VGR3 overlaps gate region GR5 and metal zero region ZR1 such that via structure VG3 electrically connects gate structure G5 to metal zero segment M01, via region VGR4 overlaps gate region GR3 and metal zero region ZR3 such that via structure VG4 electrically connects gate structure G3 to metal zero segment M03, via region VGR5 overlaps gate region GR4 and metal zero region ZR4 such that via structure VG5 electrically connects gate structure G4 to metal zero segment M04, and via region VGR6 overlaps gate region GR5 and metal zero region ZR4 such that via structure VG6 electrically connects gate structure G5 to metal zero segment M04.

Via region V0R1 overlaps metal zero region ZR1 and metal one region 1R2 such that via structure V01 electrically connects metal zero segment M01 to metal one segment M12, and via region VGR2 overlaps metal zero region ZR4 and metal one region 1R1 such that via structure V02 electrically connects metal zero segment M04 to metal one segment M11. Via region V1R1 overlaps metal one region 1R1 and metal two region 2R1 such that via structure V11 electrically connects metal one segment M11 to metal two segment M21, and via region V1R2 overlaps metal one region 1R2 and metal two region 2R1 such that via structure V12 electrically connects metal one segment M12 to metal two segment M21.

The intersection of gate region GR4 and active region AR1 corresponds to transistor P1 including a portion of gate structure G4 equivalent to gate A1 and portions of active area AA1 underlying and adjacent to gate structure G4. The intersection of gate region GR5 and active region AR1 corresponds to transistor P2 including a portion of gate structure G5 equivalent to gate B1 and portions of active area AA1 underlying and adjacent to gate structure G5. The intersection of gate region GR4 and active region AR2 corresponds to transistor N1 including a portion of gate structure G4 equivalent to gate B2 and portions of active area AA2 underlying and adjacent to gate structure G4. The intersection of gate region GR5 and active region AR2 corresponds to transistor N2 including a portion of gate structure G5 equivalent to gate A2 and portions of active area AA2 underlying and adjacent to gate structure G5.

IC structure 1100B based on IC layout diagram 1100A thereby includes conductive path PA between gates A1 and A2 including via structure VG2, metal zero segment M01, via structure VG1, gate structure G3, via structure VG4, metal zero segment M03, via structure VD1, MD segment MD6, via structure VD2, metal zero segment M04, and via structure VG6; conductive path PB between gates B1 and B2 including via structure VG3, metal zero segment M01, via structure V01, metal one segment M12, via structure V12, metal two segment M21, via structure V11, metal one segment M11, via structure V02, metal zero segment M04, and via structure VG5; and conductive path PC including MD segment MD4 (overlying the portion of active area AA1 shared by transistors P1 and P2 and the portion of active area AA2 shared by transistors N1 and N2).

Figure 12:
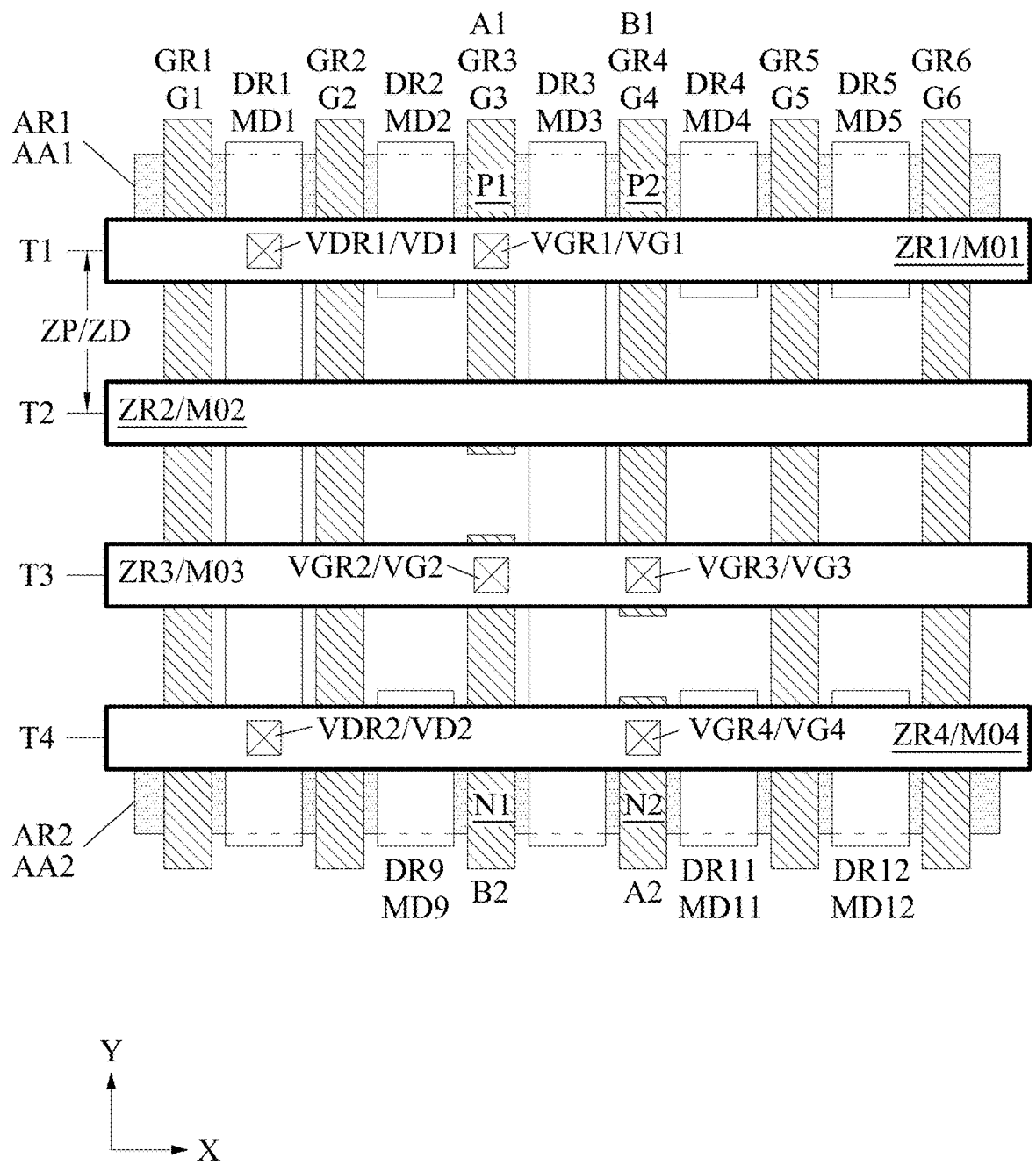
FIG. 12 is a diagram of an IC layout diagram and an IC structure, in accordance with some embodiments.

FIG. 12 is a diagram of IC layout diagram 1200A and IC structure 1200B, in accordance with some embodiments. IC layout diagram 1200A includes MD regions DR1-DR5, DR9, DR11, and DR12, gate regions GR1-GR6, and via regions VDR1, VDR2 and VGR1-VGR4. Correspondingly, IC structure 1200B includes MD segments MD1-MD5, MD9, MD11, and MD12, gate structures G1-G6, and via structures VD1, VD2, and VG1-VG4.

Each of MD regions DR1 and DR3 overlaps active regions AR1 and AR2 such that MD segments MD1 and MD3 overlie active areas AA1 and AA2, each of MD regions DR2, DR4, and DR5 overlaps active region AR1 such that MD segments MD2, MD4, and MD5 overlie active area AA1, and each of MD regions DR9, DR11, and DR12 overlaps active region AR2 such that MD segments MD9, MD11, and MD12 overlie active area AA2. Gate region GR3 includes a gap, otherwise referred to as a cut poly region in some embodiments, between metal zero regions ZR2 and ZR3 such that gate structure G3 includes a nonconductive discontinuity between metal zero segments M02 and M03. Gate region GR4 includes a gap, otherwise referred to as a cut poly region in some embodiments, between metal zero regions ZR3 and ZR4 such that gate structure G4 includes a nonconductive discontinuity between metal zero segments M03 and M04.

Via region VDR1 overlaps MD region DR1 and metal zero region ZR1 such that via structure VD1 electrically connects MD segment MD1 to metal zero segment M01, and via region VDR2 overlaps MD region DR1 and metal zero region ZR4 such that via structure VD2 electrically connects MD segment MD1 to metal zero segment M04. Via region VGR1 overlaps gate region GR3 and metal zero region ZR1 such that via structure VG1 electrically connects gate structure G3 to metal zero segment M01, via region VGR2 overlaps gate region GR3 and metal zero region ZR3 such that via structure VG2 electrically connects gate structure G3 to metal zero segment M03, via region VGR3 overlaps gate region GR4 and metal zero region ZR3 such that via structure VG3 electrically connects gate structure G4 to metal zero segment M03, and via region VGR4 overlaps gate region GR4 and metal zero region ZR4 such that via structure VG4 electrically connects gate structure G4 to metal zero segment M04.

The intersection of gate region GR3 and active region AR1 corresponds to transistor P1 including a portion of gate structure G3 equivalent to gate A1 and portions of active area AA1 underlying and adjacent to gate structure G3. The intersection of gate region GR4 and active region AR1 corresponds to transistor P2 including a portion of gate structure G4 equivalent to gate B1 and portions of active area AA1 underlying and adjacent to gate structure G4. The intersection of gate region GR3 and active region AR2 corresponds to transistor N1 including a portion of gate structure G3 equivalent to gate B2 and portions of active area AA2 underlying and adjacent to gate structure G3. The intersection of gate region GR4 and active region AR2 corresponds to transistor N2 including a portion of gate structure G4 equivalent to gate A2 and portions of active area AA2 underlying and adjacent to gate structure G4.

IC structure 1200B based on IC layout diagram 1200A thereby includes conductive path PA between gates A1 and A2 including via structure VG1, metal zero segment M01, via structure VD1, MD segment MD1, via structure VD2, metal zero segment M04, and via structure VG4; conductive path PB between gates B1 and B2 including gate structure G4, via structure VG3, metal zero segment M03, via structure VG2, and gate structure G3; and conductive path PC including MD segment MD3 (overlying the portion of active area AA1 shared by transistors P1 and P2 and the portion of active area AA2 shared by transistors N1 and N2).

Figure 13:
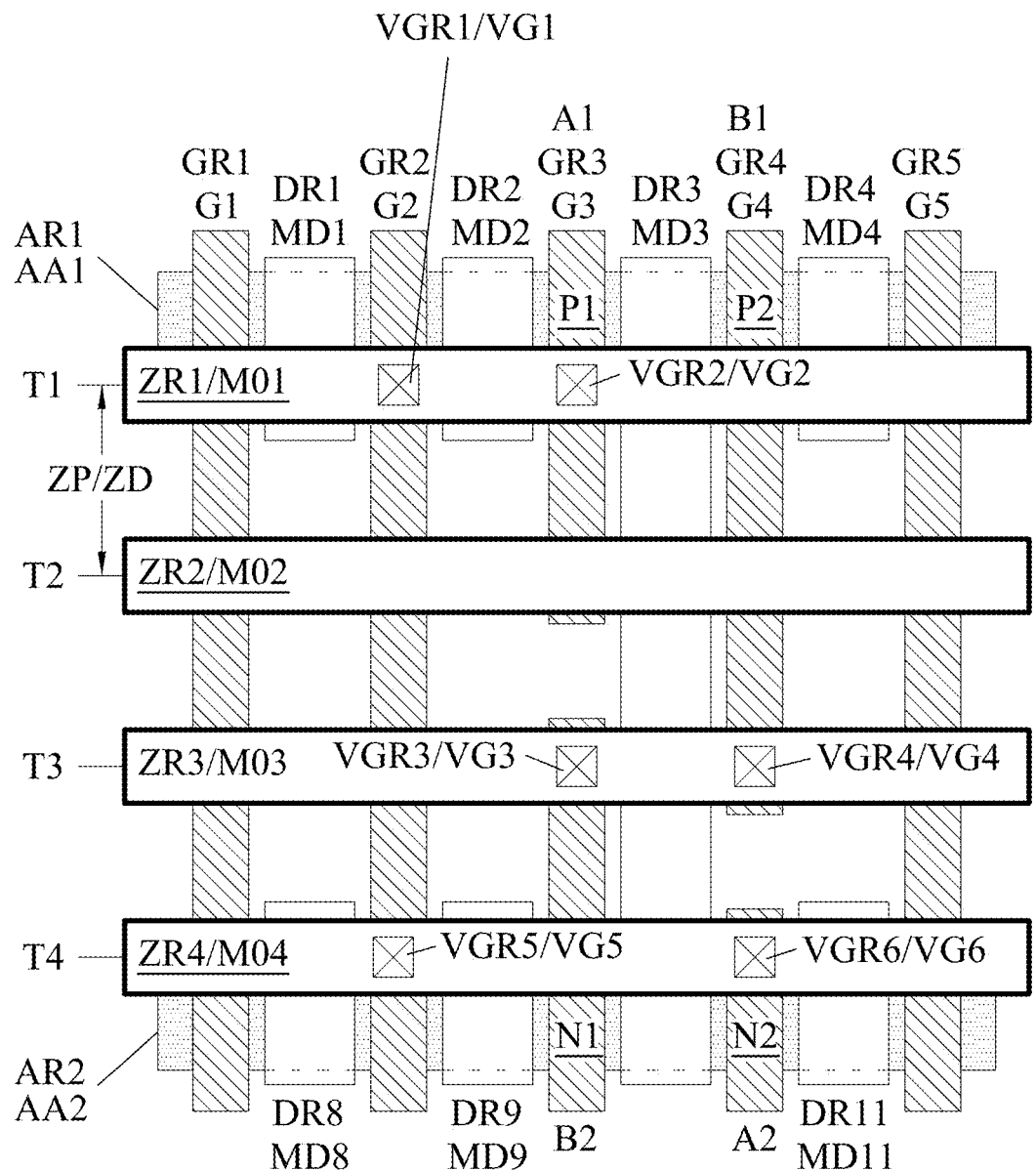
FIG. 13 is a diagram of an IC layout diagram and an IC structure, in accordance with some embodiments.

FIG. 13 is a diagram of IC layout diagram 1300A and IC structure 1300B, in accordance with some embodiments. IC layout diagram 1300A includes MD regions DR1-DR4, DR8, DR9, and DR11, gate regions GR1-GR5, and via regions VGR1-VGR6. Correspondingly, IC structure 1300B includes MD segments MD1-MD4, MD8, MD9, and MD11, gate structures G1-G5, and via structures VG1-VG6.

Each of MD regions DR1, DR2, and DR4 overlaps active region AR1 such that MD segments MD1, MD2, and MD4 overlie active area AA1, MD region DR3 overlaps active regions AR1 and AR2 such that MD segment MD3 overlies active areas AA1 and AA2, and each of MD regions DR8, DR9, and DR11 overlaps active region AR2 such that MD segments MD8, MD9, and MD11 overlie active area AA2. Gate region GR3 includes a gap, otherwise referred to as a cut poly region in some embodiments, between metal zero regions ZR2 and ZR3 such that gate structure G3 includes a nonconductive discontinuity between metal zero segments M02 and M03. Gate region GR4 includes a gap, otherwise referred to as a cut poly region in some embodiments, between metal zero regions ZR3 and ZR4 such that gate structure G4 includes a nonconductive discontinuity between metal zero segments M03 and M04.

Via region VGR1 overlaps gate region GR2 and metal zero region ZR1 such that via structure VG1 electrically connects gate structure G2 to metal zero segment M01, via region VGR2 overlaps gate region GR3 and metal zero region ZR1 such that via structure VG2 electrically connects gate structure G3 to metal zero segment M01, via region VGR3 overlaps gate region GR3 and metal zero region ZR3 such that via structure VG3 electrically connects gate structure G3 to metal zero segment M03, via region VGR4 overlaps gate region GR4 and metal zero region ZR3 such that via structure VG4 electrically connects gate structure G4 to metal zero segment M03, via region VGR5 overlaps gate region GR2 and metal zero region ZR4 such that via structure VG5 electrically connects gate structure G2 to metal zero segment M04, and via region VGR6 overlaps gate region GR4 and metal zero region ZR4 such that via structure VG6 electrically connects gate structure G4 to metal zero segment M04.

The intersection of gate region GR3 and active region AR1 corresponds to transistor P1 including a portion of gate structure G3 equivalent to gate A1 and portions of active area AA1 underlying and adjacent to gate structure G3. The intersection of gate region GR4 and active region AR1 corresponds to transistor P2 including a portion of gate structure G4 equivalent to gate B1 and portions of active area AA1 underlying and adjacent to gate structure G4. The intersection of gate region GR3 and active region AR2 corresponds to transistor N1 including a portion of gate structure G3 equivalent to gate B2 and portions of active area AA2 underlying and adjacent to gate structure G3. The intersection of gate region GR4 and active region AR2 corresponds to transistor N2 including a portion of gate structure G4 equivalent to gate A2 and portions of active area AA2 underlying and adjacent to gate structure G4.

IC structure 1300B based on IC layout diagram 1300A thereby includes conductive path PA between gates A1 and A2 including via structure VG2, metal zero segment M01, via structure VG1, gate structure G2, via structure VG5, metal zero segment M04, and via structure VG6; conductive path PB between gates B1 and B2 including gate structure G4, via structure VG4, metal zero segment M03, via structure VG3, and gate structure G3; and conductive path PC including MD segment MD3 (overlying the portion of active area AA1 shared by transistors P1 and P2 and the portion of active area AA2 shared by transistors N1 and N2).

Figure 14:
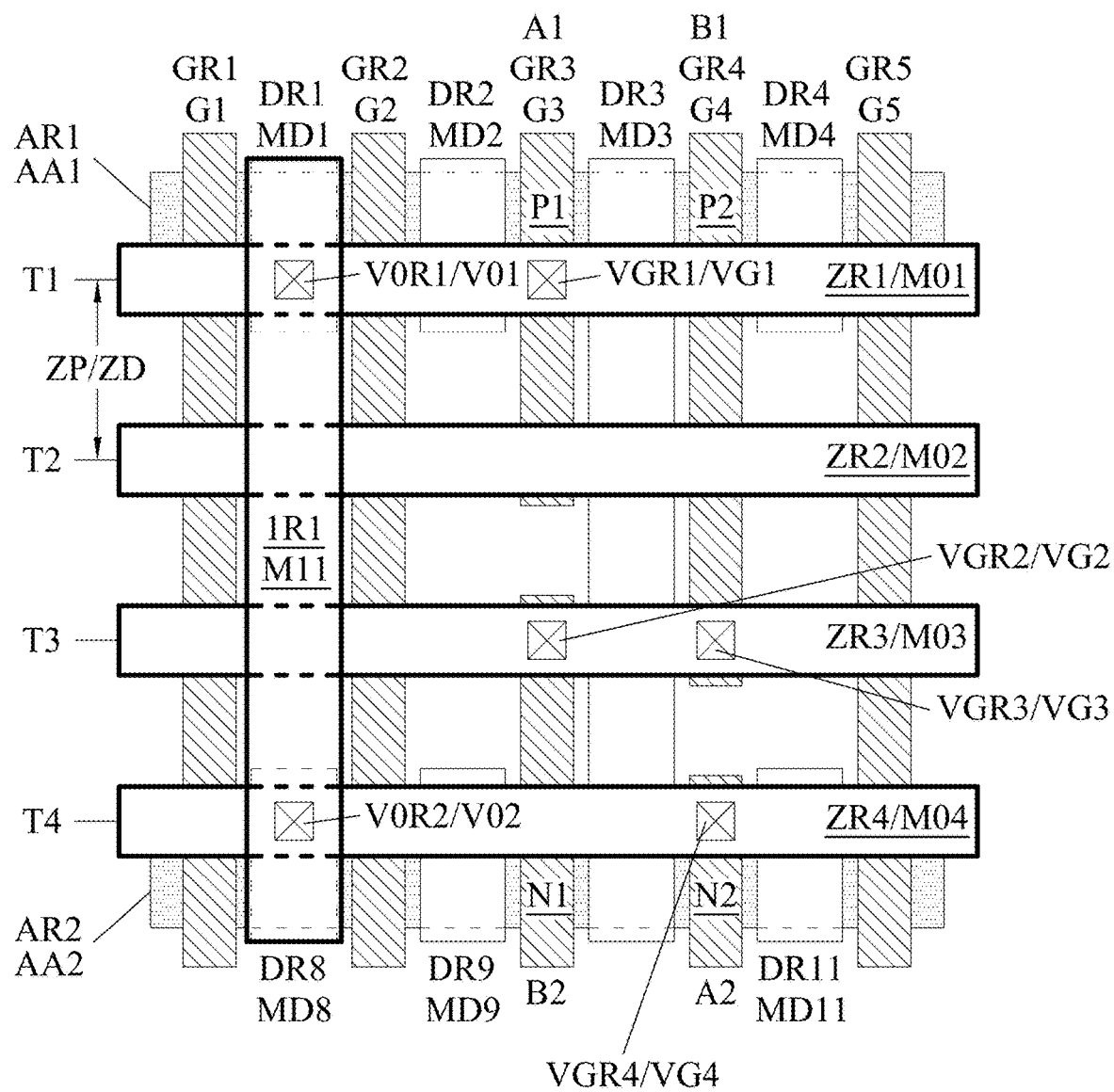
FIG. 14 is a diagram of an IC layout diagram and an IC structure, in accordance with some embodiments.

FIG. 14 is a diagram of IC layout diagram 1400A and IC structure 1400B, in accordance with some embodiments. IC layout diagram 1400A includes MD regions DR1-DR4, DR8, DR9, and DR11, gate regions GR1-GR5, metal one region 1R1, and via regions VGR1-VGR4, V0R1, and V0R2. Correspondingly, IC structure 1400B includes MD segments MD1-MD4, MD8, MD9, and MD11, gate structures G1-G5, metal one segment M11, and via structures VG1-VG4, V01, and V02.

Each of MD regions DR1, DR2, and DR4 overlaps active region AR1 such that MD segments MD1, MD2, and MD4 overlie active area AA1, MD region DR3 overlaps active regions AR1 and AR2 such that MD segment MD3 overlies active areas AA1 and AA2, and each of MD regions DR8, DR9, and DR11 overlaps active region AR2 such that MD segments MD8, MD9, and MD11 overlie active area AA2. Gate region GR3 includes a gap, otherwise referred to as a cut poly region in some embodiments, between metal zero regions ZR2 and ZR3 such that gate structure G3 includes a nonconductive discontinuity between metal zero segments M02 and M03. Gate region GR4 includes a gap, otherwise referred to as a cut poly region in some embodiments, between metal zero regions ZR3 and ZR4 such that gate structure G4 includes a nonconductive discontinuity between metal zero segments M03 and M04. Metal one region 1R1 intersects each of metal zero regions ZR1-ZR4 between gate regions GR1 and GR2 such that metal one segment M11 overlies each of metal zero segments M01-M04 between gate structures G1 and G2.

Via region VGR1 overlaps gate region GR3 and metal zero region ZR1 such that via structure VG1 electrically connects gate structure G3 to metal zero segment M01, via region VGR2 overlaps gate region GR3 and metal zero region ZR3 such that via structure VG2 electrically connects gate structure G3 to metal zero segment M03, via region VGR3 overlaps gate region GR4 and metal zero region ZR3 such that via structure VG3 electrically connects gate structure G4 to metal zero segment M03, and via region VGR4 overlaps gate region GR4 and metal zero region ZR4 such that via structure VG4 electrically connects gate structure G4 to metal zero segment M04. Via region V0R1 overlaps metal zero region ZR1 and metal one region 1R1 such that via structure V01 electrically connects metal zero segment M01 to metal one segment M11, and via region V0R2 overlaps metal zero region ZR4 and metal one region 1R1 such that via structure V02 electrically connects metal zero segment M04 to metal one segment M11.

The intersection of gate region GR3 and active region AR1 corresponds to transistor P1 including a portion of gate structure G3 equivalent to gate A1 and portions of active area AA1 underlying and adjacent to gate structure G3. The intersection of gate region GR4 and active region AR1 corresponds to transistor P2 including a portion of gate structure G4 equivalent to gate B1 and portions of active area AA1 underlying and adjacent to gate structure G4. The intersection of gate region GR3 and active region AR2 corresponds to transistor N1 including a portion of gate structure G3 equivalent to gate B2 and portions of active area AA2 underlying and adjacent to gate structure G3. The intersection of gate region GR4 and active region AR2 corresponds to transistor N2 including a portion of gate structure G4 equivalent to gate A2 and portions of active area AA2 underlying and adjacent to gate structure G4.

IC structure 1400B based on IC layout diagram 1400A thereby includes conductive path PA between gates A1 and A2 including via structure VG1, metal zero segment M01, via structure V01, metal one segment M11, via structure V02, metal zero segment M04, and via structure VG5; conductive path PB between gates B1 and B2 including gate structure G4, via structure VG3, metal zero segment M03, via structure VG2, and gate structure G3; and conductive path PC including MD segment MD3 (overlying the portion of active area AA1 shared by transistors P1 and P2 and the portion of active area AA2 shared by transistors N1 and N2).

Figure 15:
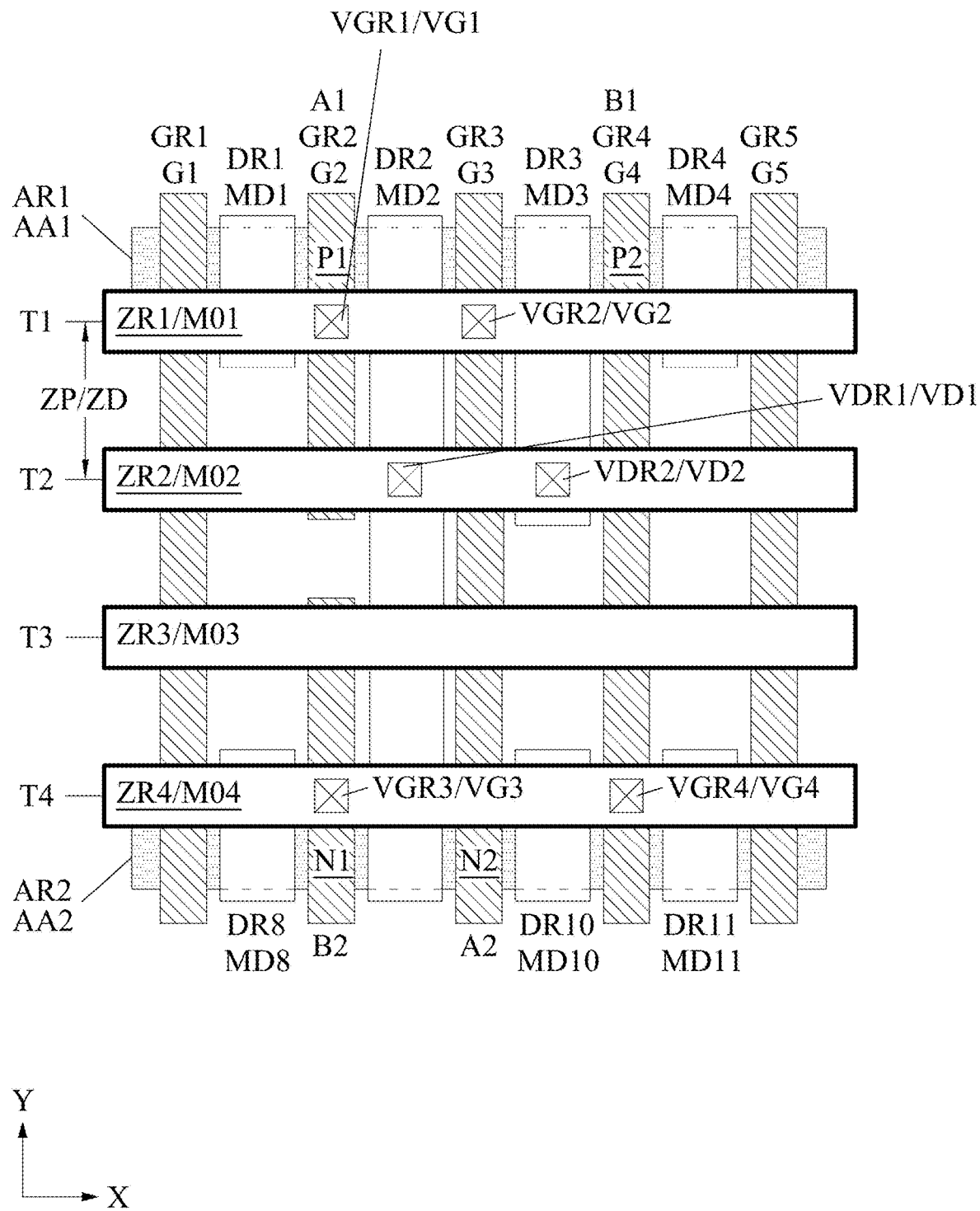
FIG. 15 is a diagram of an IC layout diagram and an IC structure, in accordance with some embodiments.

FIG. 15 is a diagram of IC layout diagram 1500A and IC structure 1500B, in accordance with some embodiments. IC layout diagram 1500A includes MD regions DR1-DR4, DR8, DR10, and DR11, gate regions GR1-GR5, and via regions VDR1, VDR2 and VGR1-VGR4. Correspondingly, IC structure 1500B includes MD segments MD1-MD4, MD8, MD10, and MD11, gate structures G1-G5, and via structures VD1, VD2, and VG1-VG4.

Each of MD regions DR1, DR3, and DR4 overlaps active region AR1 such that MD segments MD1, MD3, and MD4 overlie active area AA1, MD region DR2 overlaps active regions AR1 and AR2 such that MD segment MD2 overlies active areas AA1 and AA2, and each of MD regions DR8, DR10, and DR11 overlaps active region AR2 such that MD segments MD8, MD10, and MD11 overlie active area AA2. MD region DR3 overlaps metal zero region ZR2 such that metal zero segment M02 overlies MD segment MD3. Gate region GR2 includes a gap, otherwise referred to as a cut poly region in some embodiments, between metal zero regions ZR2 and ZR3 such that gate structure G2 includes a nonconductive discontinuity between metal zero segments M02 and M03.

Via region VDR1 overlaps MD region DR2 and metal zero region ZR2 such that via structure VD1 electrically connects MD segment MD2 to metal zero segment M02, and via region VDR2 overlaps MD region DR3 and metal zero region ZR2 such that via structure VD2 electrically connects MD segment MD3 to metal zero segment M02. Via region VGR1 overlaps gate region GR2 and metal zero region ZR1 such that via structure VG1 electrically connects gate structure G2 to metal zero segment M01, via region VGR2 overlaps gate region GR3 and metal zero region ZR1 such that via structure VG2 electrically connects gate structure G3 to metal zero segment M01, via region VGR3 overlaps gate region GR2 and metal zero region ZR4 such that via structure VG3 electrically connects gate structure G2 to metal zero segment M04, and via region VGR4 overlaps gate region GR4 and metal zero region ZR4 such that via structure VG4 electrically connects gate structure G4 to metal zero segment M04.

The intersection of gate region GR2 and active region AR1 corresponds to transistor P1 including a portion of gate structure G2 equivalent to gate A1 and portions of active area AA1 underlying and adjacent to gate structure G2. The intersection of gate region GR4 and active region AR1 corresponds to transistor P2 including a portion of gate structure G4 equivalent to gate B1 and portions of active area AA1 underlying and adjacent to gate structure G4. The intersection of gate region GR2 and active region AR2 corresponds to transistor N1 including a portion of gate structure G2 equivalent to gate B2 and portions of active area AA2 underlying and adjacent to gate structure G2. The intersection of gate region GR3 and active region AR2 corresponds to transistor N2 including a portion of gate structure G3 equivalent to gate A2 and portions of active area AA2 underlying and adjacent to gate structure G3.

IC structure 1500B based on IC layout diagram 1500A thereby includes conductive path PA between gates A1 and A2 including via structure VG1, metal zero segment M01, via structure VG2, and gate structure G3; conductive path PB between gates B1 and B2 including gate structure G4, via structure VG4, metal zero segment M04, and via structure VG3; and conductive path PC including MD segment MD2 (overlying a portion of active area AA1 included in transistor P1 and the portion of active area AA2 shared by transistors N1 and N2), MD segment MD3 (overlying a portion of active area AA1 included in transistor P2), via structure VD2, metal zero segment M02, and via structure VD1.

Figure 16:
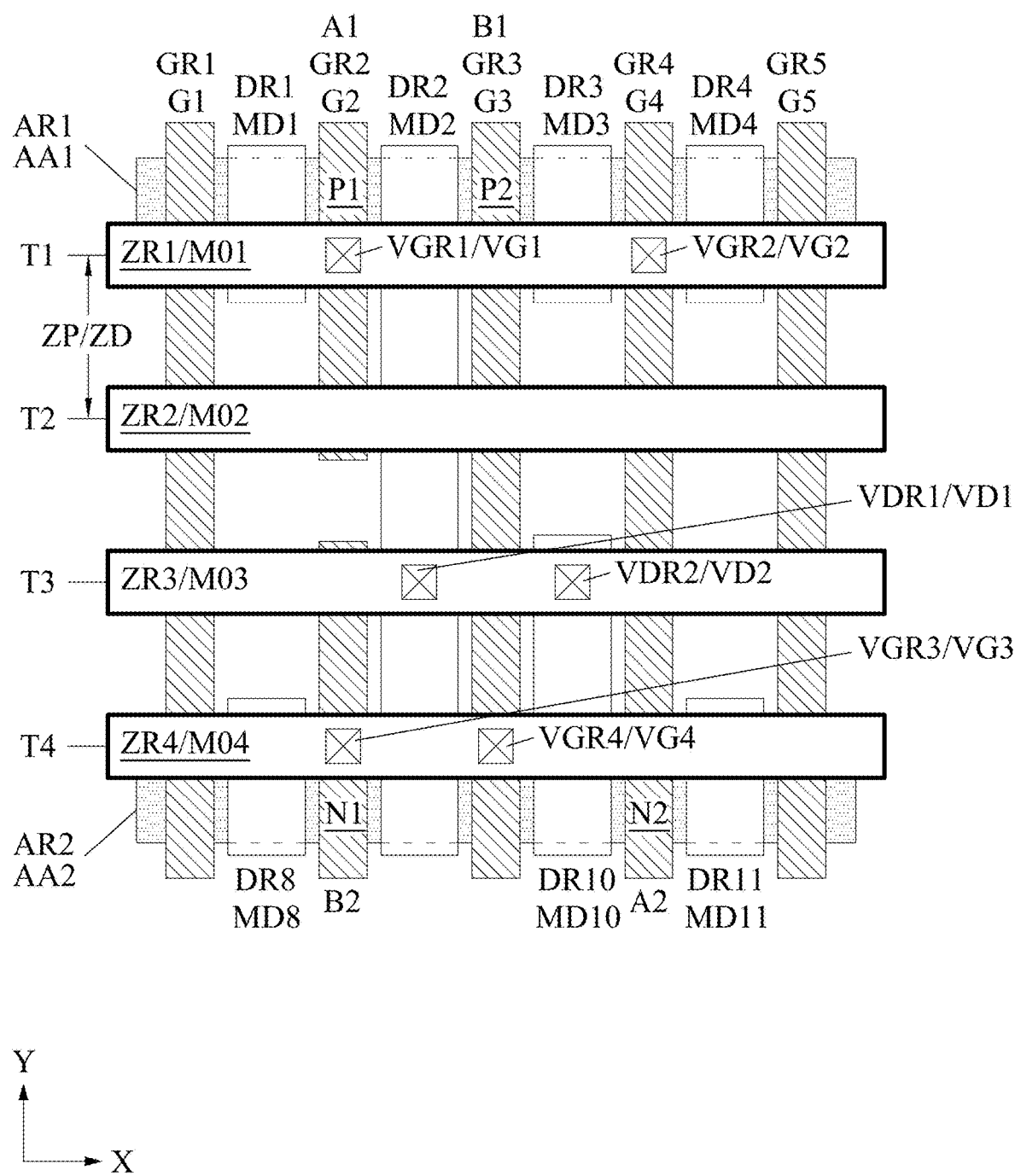
FIG. 16 is a diagram of an IC layout diagram and an IC structure, in accordance with some embodiments.

FIG. 16 is a diagram of IC layout diagram 1600A and IC structure 1600B, in accordance with some embodiments. IC layout diagram 1600A includes MD regions DR1-DR4, DR8, DR10, and DR11, gate regions GR1-GR5, and via regions VDR1, VDR2 and VGR1-VGR4. Correspondingly, IC structure 1600B includes MD segments MD1-MD4, MD8, MD10, and MD11, gate structures G1-G5, and via structures VD1, VD2, and VG1-VG4.

Each of MD regions DR1, DR3, and DR4 overlaps active region AR1 such that MD segments MD1, MD3, and MD4 overlie active area AA1, MD region DR2 overlaps active regions AR1 and AR2 such that MD segment MD2 overlies active areas AA1 and AA2, and each of MD regions DR8, DR10, and DR11 overlaps active region AR2 such that MD segments MD8, MD10, and MD11 overlie active area AA2. MD region DR10 overlaps metal zero region ZR3 such that metal zero segment M03 overlies MD segment MD10. Gate region GR2 includes a gap, otherwise referred to as a cut poly region in some embodiments, between metal zero regions ZR2 and ZR3 such that gate structure G2 includes a nonconductive discontinuity between metal zero segments M02 and M03.

Via region VDR1 overlaps MD region DR2 and metal zero region ZR3 such that via structure VD1 electrically connects MD segment MD2 to metal zero segment M03, and via region VDR2 overlaps MD region DR10 and metal zero region ZR3 such that via structure VD2 electrically connects MD segment MD10 to metal zero segment M03. Via region VGR1 overlaps gate region GR2 and metal zero region ZR1 such that via structure VG1 electrically connects gate structure G2 to metal zero segment M01, via region VGR2 overlaps gate region GR4 and metal zero region ZR1 such that via structure VG2 electrically connects gate structure G4 to metal zero segment M01, via region VGR3 overlaps gate region GR2 and metal zero region ZR4 such that via structure VG3 electrically connects gate structure G2 to metal zero segment M04, and via region VGR4 overlaps gate region GR3 and metal zero region ZR4 such that via structure VG4 electrically connects gate structure G3 to metal zero segment M04.

The intersection of gate region GR2 and active region AR1 corresponds to transistor P1 including a portion of gate structure G2 equivalent to gate A1 and portions of active area AA1 underlying and adjacent to gate structure G2. The intersection of gate region GR3 and active region AR1 corresponds to transistor P2 including a portion of gate structure G3 equivalent to gate B1 and portions of active area AA1 underlying and adjacent to gate structure G3. The intersection of gate region GR2 and active region AR2 corresponds to transistor N1 including a portion of gate structure G2 equivalent to gate B2 and portions of active area AA2 underlying and adjacent to gate structure G2. The intersection of gate region GR4 and active region AR2 corresponds to transistor N2 including a portion of gate structure G4 equivalent to gate A2 and portions of active area AA2 underlying and adjacent to gate structure G4.

IC structure 1600B based on IC layout diagram 1600A thereby includes conductive path PA between gates A1 and A2 including via structure VG1, metal zero segment M01, via structure VG2, and gate structure G4; conductive path PB between gates B1 and B2 including gate structure G3, via structure VG4, metal zero segment M04, and via structure VG3; and conductive path PC including MD segment MD2 (overlying the portion of active area AA1 shared by transistors P1 and P2 and a portion of active area AA2 included in transistor N1), MD segment MD10 (overlying a portion of active area AA2 included in transistor N2), via structure VD2, metal zero segment M03, and via structure VD1.

Figure 17:
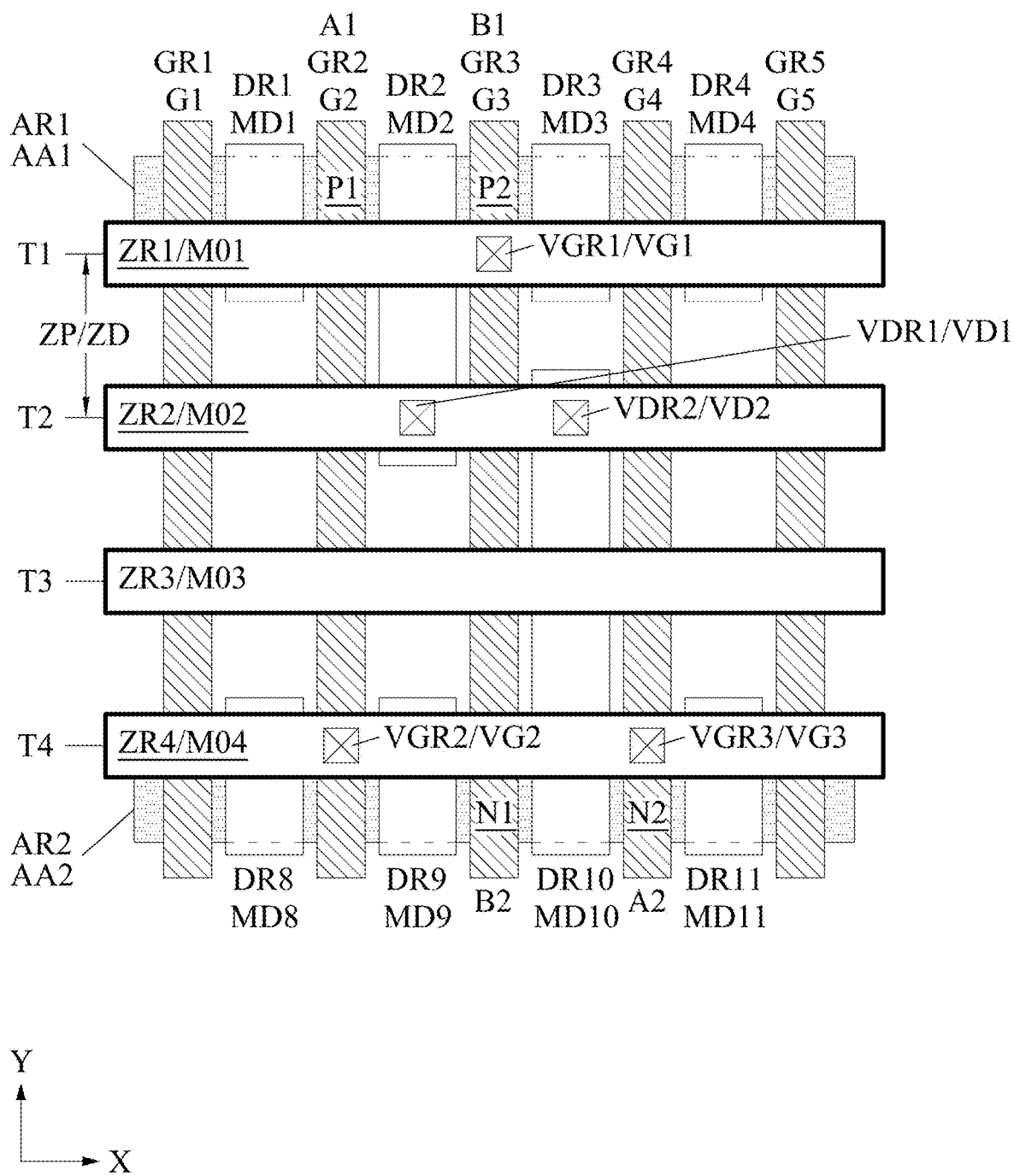
FIG. 17 is a diagram of an IC layout diagram and an IC structure, in accordance with some embodiments.

FIG. 17 is a diagram of IC layout diagram 1700A and IC structure 1700B, in accordance with some embodiments. IC layout diagram 1700A includes MD regions DR1-DR4 and DR8-DR11, gate regions GR1-GR5, and via regions VDR1, VDR2 and VGR1-VGR3. Correspondingly, IC structure 1700B includes MD segments MD1-MD4 and MD8-MD11, gate structures G1-G5, and via structures VD1, VD2, and VG1-VG3.

Each of MD regions DR1-DR4 overlaps active region AR1 such that MD segments MD1-MD4 overlie active area AA1, and each of and each of MD regions DR8-DR11 overlaps active region AR2 such that MD segments MD8-MD11 overlie active area AA2. MD region DR2 overlaps metal zero region ZR2 such that metal zero segment M02 overlies MD segment MD2, and MD region DR10 overlaps metal zero regions ZR2 and ZR3 such that metal zero segments M02 and M03 overlie MD segment MD10.

Via region VDR1 overlaps MD region DR2 and metal zero region ZR2 such that via structure VD1 electrically connects MD segment MD2 to metal zero segment M02, and via region VDR2 overlaps MD region DR10 and metal zero region ZR2 such that via structure VD2 electrically connects MD segment MD10 to metal zero segment M02. Via region VGR1 overlaps gate region GR3 and metal zero region ZR1 such that via structure VG1 electrically connects gate structure G3 to metal zero segment M01, via region VGR2 overlaps gate region GR2 and metal zero region ZR4 such that via structure VG2 electrically connects gate structure G2 to metal zero segment M04, and via region VGR3 overlaps gate region GR4 and metal zero region ZR4 such that via structure VG3 electrically connects gate structure G4 to metal zero segment M04.

The intersection of gate region GR2 and active region AR1 corresponds to transistor P1 including a portion of gate structure G2 equivalent to gate A1 and portions of active area AA1 underlying and adjacent to gate structure G2. The intersection of gate region GR3 and active region AR1 corresponds to transistor P2 including a portion of gate structure G3 equivalent to gate B1 and portions of active area AA1 underlying and adjacent to gate structure G3. The intersection of gate region GR3 and active region AR2 corresponds to transistor N1 including a portion of gate structure G3 equivalent to gate B2 and portions of active area AA2 underlying and adjacent to gate structure G3. The intersection of gate region GR4 and active region AR2 corresponds to transistor N2 including a portion of gate structure G4 equivalent to gate A2 and portions of active area AA2 underlying and adjacent to gate structure G4.

IC structure 1700B based on IC layout diagram 1700A thereby includes conductive path PA between gates A1 and A2 including gate structure G2, via structure VG2, metal zero segment M04, and via structure VG3; conductive path PB between gates B1 and B2 including gate structure G3; and conductive path PC including MD segment MD2 (overlying the portion of active area AA1 shared by transistors P1 and P2), via structure VD1, metal zero segment M02, via structure VD2, and MD segment MD10 (overlying the portion of active area AA1 shared by transistors N1 and N2).

Figure 18:
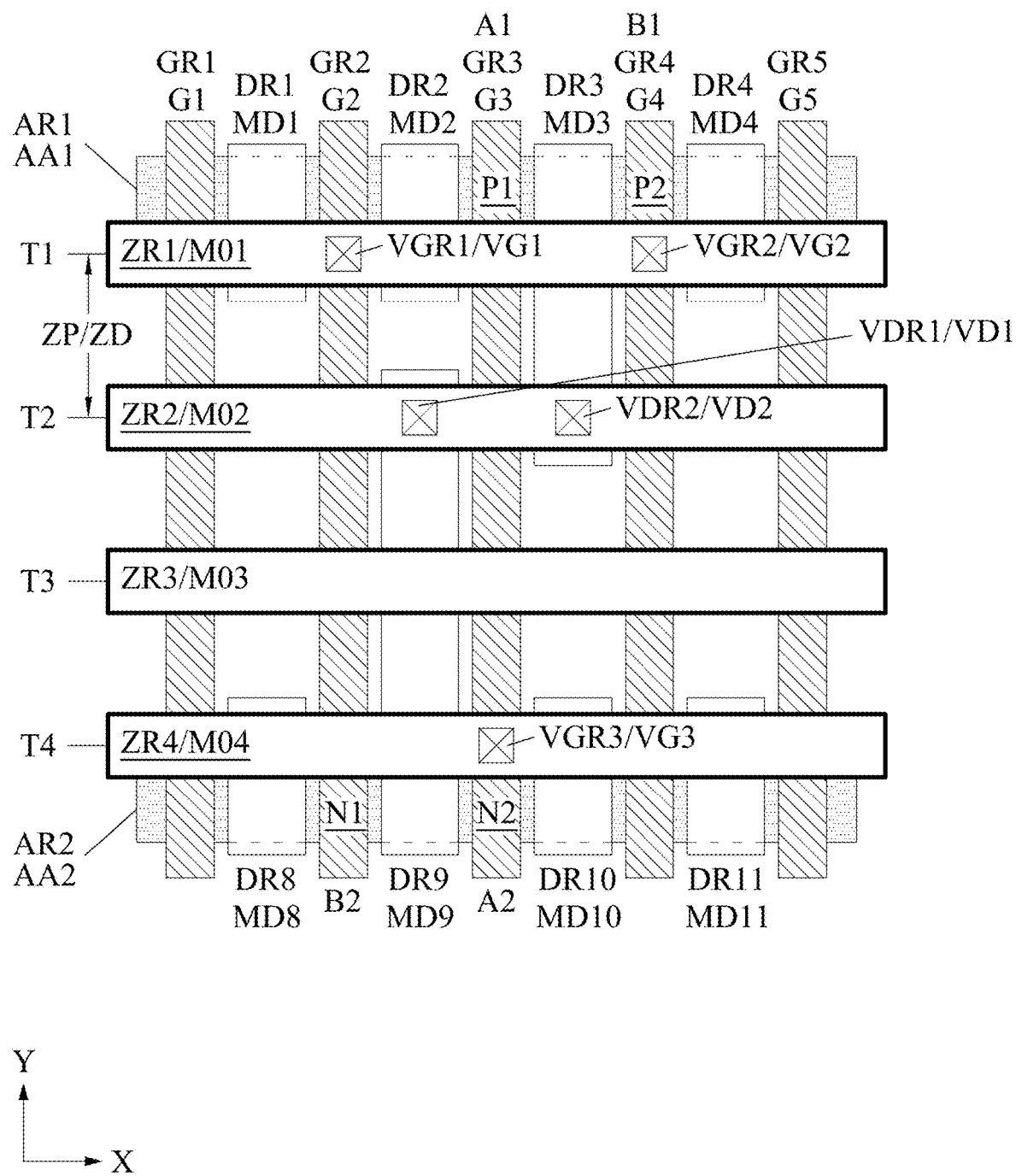
FIG. 18 is a diagram of an IC layout diagram and an IC structure, in accordance with some embodiments.

FIG. 18 is a diagram of IC layout diagram 1800A and IC structure 1800B, in accordance with some embodiments. IC layout diagram 1800A includes MD regions DR1-DR4 and DR8-DR11, gate regions GR1-GR5, and via regions VDR1, VDR2 and VGR1-VGR3. Correspondingly, IC structure 1800B includes MD segments MD1-MD4 and MD8-MD11, gate structures G1-G5, and via structures VD1, VD2, and VG1-VG3.

Each of MD regions DR1-DR4 overlaps active region AR1 such that MD segments MD1-MD4 overlie active area AA1, and each of and each of MD regions DR8-DR11 overlaps active region AR2 such that MD segments MD8-MD11 overlie active area AA2. MD region DR3 overlaps metal zero region ZR2 such that metal zero segment M02 overlies MD segment MD3, and MD region DR9 overlaps metal zero regions ZR2 and ZR3 such that metal zero segments M02 and M03 overlie MD segment MD9.

Via region VDR1 overlaps MD region DR9 and metal zero region ZR2 such that via structure VD1 electrically connects MD segment MD9 to metal zero segment M02, and via region VDR2 overlaps MD region DR3 and metal zero region ZR2 such that via structure VD2 electrically connects MD segment MD3 to metal zero segment M02. Via region VGR1 overlaps gate region GR2 and metal zero region ZR1 such that via structure VG1 electrically connects gate structure G2 to metal zero segment M01, via region VGR2 overlaps gate region GR4 and metal zero region ZR1 such that via structure VG2 electrically connects gate structure G4 to metal zero segment M01, and via region VGR3 overlaps gate region GR3 and metal zero region ZR4 such that via structure VG3 electrically connects gate structure G3 to metal zero segment M04.

The intersection of gate region GR3 and active region AR1 corresponds to transistor P1 including a portion of gate structure G3 equivalent to gate A1 and portions of active area AA1 underlying and adjacent to gate structure G3. The intersection of gate region GR4 and active region AR1 corresponds to transistor P2 including a portion of gate structure G4 equivalent to gate B1 and portions of active area AA1 underlying and adjacent to gate structure G4. The intersection of gate region GR2 and active region AR2 corresponds to transistor N1 including a portion of gate structure G2 equivalent to gate B2 and portions of active area AA2 underlying and adjacent to gate structure G2. The intersection of gate region GR3 and active region AR2 corresponds to transistor N2 including a portion of gate structure G3 equivalent to gate A2 and portions of active area AA2 underlying and adjacent to gate structure G3.

IC structure 1800B based on IC layout diagram 1800A thereby includes conductive path PA between gates A1 and A2 including gate structure G3; conductive path PB between gates B1 and B2 including via structure VG2, metal zero segment M01, via structure VG1, and gate structure G2; and conductive path PC including MD segment MD3 (overlying the portion of active area AA1 shared by transistors P1 and P2), via structure VD2, metal zero segment M02, via structure VD1, and MD segment MD9 (overlying the portion of active area AA1 shared by transistors N1 and N2).

As illustrated by the non-limiting examples depicted in FIGS. 2-18, transmission gate 100 includes conductive path PA between gates A1 and A2, conductive path between gates B1 and B2, and conductive path PC between transistor S/D terminals, at least one of the conductive paths including a metal segment perpendicular to metal zero segments. Transmission gate 100 is thereby arranged using metal zero segments corresponding to a total of four metal zero tracks such that the various embodiments have lower profiles compared to approaches based on more than four metal zero tracks, and are capable of being included in circuit layouts based on cell heights corresponding to four metal zero tracks.

FIG. 19 is a flowchart of a method 1900 of manufacturing a transmission gate, in accordance with some embodiments. Method 1900 is operable to form any of IC structures 200B-1800B, discussed above with respect to FIGS. 2-18.

The sequence in which the operations of method 1900 are depicted in FIG. 19 is for illustration only; the operations of method 1900 are capable of being executed simultaneously and/or in sequences that differ from that depicted in FIG. 19. In some embodiments, operations in addition to those depicted in FIG. 19 are performed before, between, during, and/or after the operations depicted in FIG. 19.

In some embodiments, one or more operations of method 1900 are a subset of operations of a method of forming an IC device. In some embodiments, one or more operations of method 1900 are a subset of operations of an IC manufacturing flow, e.g., an IC manufacturing flow discussed below with respect to a manufacturing system 2200 and FIG. 22.

At operation 1910, first and second active areas are overlaid with first and second metal zero segments, the metal zero segments having an offset distance based on three times a metal zero track pitch. In some embodiments, overlying the first and second active areas with the first and second metal zero segments includes forming at least four metal zero segments with a total of two metal zero segments between the first and second metal zero segments. Each metal zero segment of the four metal zero segments is offset from one or two adjacent metal segments by an offset distance corresponding to the metal zero track pitch, the first and second metal zero segments thereby being offset from each other by a distance equal to three times the offset distance.

Overlying the first active area includes overlying first and second PMOS transistors of the transmission gate positioned in the first active area, and overlying the second active area includes overlying first and second NMOS transistors of the transmission gate positioned in the second active area.

In various embodiments, overlying the first and second active areas with the first and second metal zero segments includes overlying active area AA1 with metal zero segment M01 and active area AA2 with metal zero segment M04, discussed above with respect to FIGS. 2-18. In some embodiments, forming at least four metal zero segments includes performing one or more manufacturing operations in accordance with forming metal zero segments M01-M04, discussed above with respect to FIGS. 2-18.

At operation 1920, three conductive paths are formed to configure the first and second PMOS transistors in the first active area and the first and second NMOS transistors in the second active area as a transmission gate. At least one of the conductive paths includes a conductive segment perpendicular to the metal zero segments.

Forming the first conductive path includes forming a conductive path between a gate structure of the first PMOS transistor and a gate structure of the second NMOS transistor; forming the second conducive path includes forming a conductive path between a gate structure of the second PMOS transistor and a gate structure of the first NMOS transistor; and forming the third conductive path includes forming a conductive path between one or more portions of the first active area included in one or both of the first and second PMOS transistors and one or more portions of the second active area included in one or both of the first and second NMOS transistors, thereby connecting a S/D terminal of each of the first and second PMOS transistors and first and second NMOS transistors together.

In various embodiments, forming the third conductive path includes one or more of forming an electrical connection to a single portion of the first active area shared by the first and second PMOS transistors, forming separate electrical connections to separate portions of the first active area included in the first and second PMOS transistors, forming an electrical connection to a single portion of the second active area shared by the first and second NMOS transistors, or forming separate electrical connections to separate portions of the second active area included in the first and second NMOS transistors.

Forming conductive paths, e.g., the three conductive paths, includes performing one or more manufacturing operations in accordance with forming one or more conductive segments in one or more layers of the manufacturing process. In various embodiments, forming the three conductive paths includes one or more of forming one or more MD segments, one or more gate structures, and/or one or more via structures prior to performing some or all of operation 1910, forming one or more metal zero segments and/or one or more via structures as part of or concurrently with performing some or all of operation 1910, or forming one or more metal one segments, one or more metal two segments, and/or one or more via structures after performing some or all of operation 1910.

In some embodiments, forming the three conductive paths includes forming conductive paths PA, PB, and PC discussed above with respect to transmission gate 100, IC structures 200B-1800B, and FIGS. 1-18.

At operation 1930, in some embodiments, one or more additional conductive paths are formed. Forming the one or more additional conductive paths includes forming one or more electrical connections to one or more gate or S/D structures of the first or second PMOS transistors or first or second NMOS transistors, thereby providing one or more conductive paths within the transmission gate and/or between the transmission gate and one or more IC devices external to the transmission gate. In some embodiments, forming the one or more additional conductive paths includes forming one or more electrical connections discussed above with respect to transmission gate 100.

Forming the one or more additional conductive paths includes performing one or more manufacturing operations in the manner discussed above with respect to operation 1920.

The operations of method 1900 are usable to form an IC structure that includes at least one conductive path including a conductive element perpendicular to a total of four metal zero segments spanning two active areas, and is thereby configured to have the properties and benefits discussed above with respect to IC structures 200B-1800B.

Figure 20:
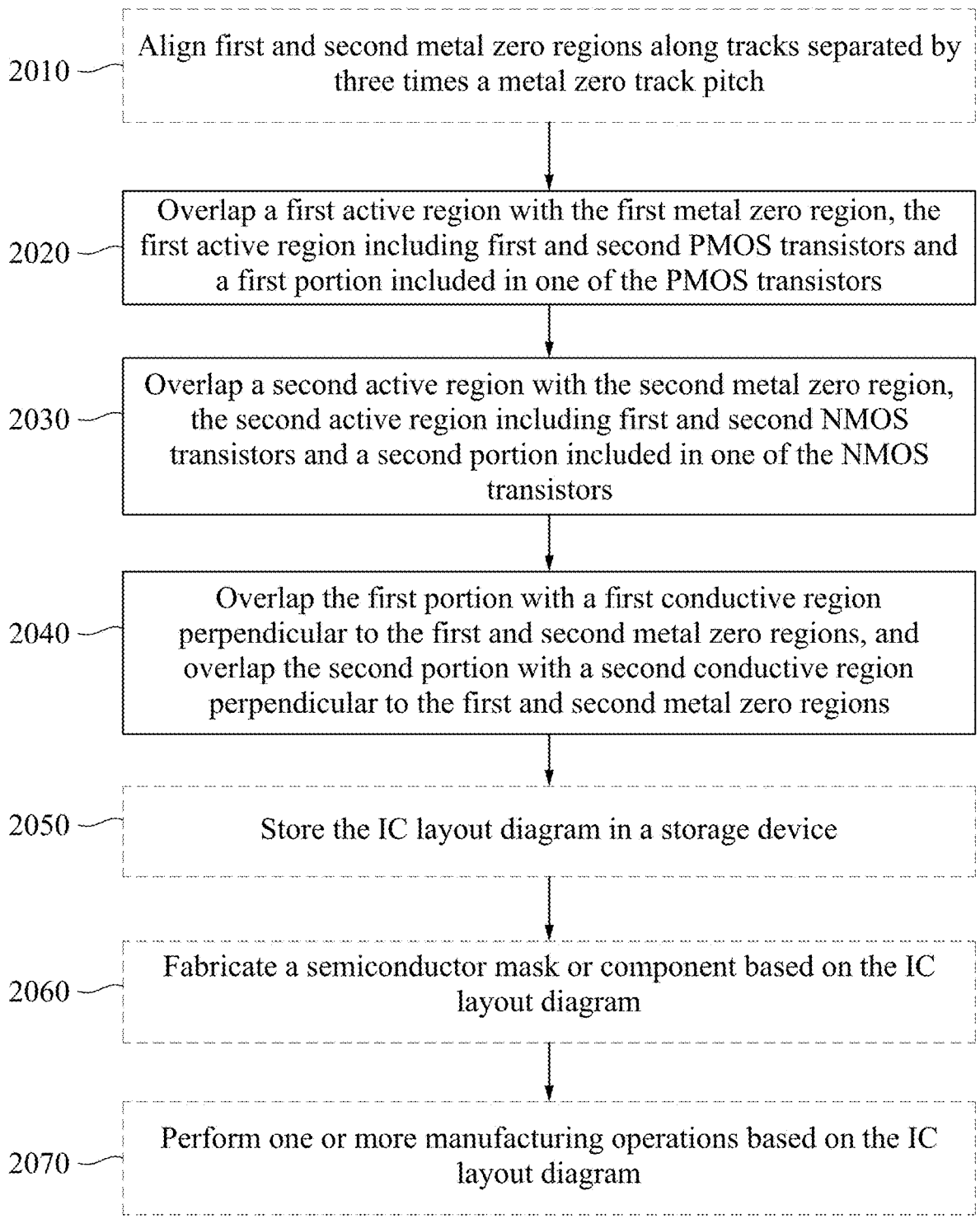
FIG. 20 is a flowchart of a method of operating an IC manufacturing system, in accordance with some embodiments.

FIG. 20 is a flowchart of a method 2000 of operating an IC manufacturing system, in accordance with some embodiments. In some embodiments, operating the IC manufacturing system includes generating an IC layout diagram, e.g., one of IC layout diagrams 200A-1800A, corresponding to an IC structure, e.g., one of IC structures 200B-1800B discussed above with respect to FIGS. 1-18, manufactured based on the generated IC layout diagram. In some embodiments, operating the IC manufacturing system is part of operating an IC manufacturing system as part of manufacturing an IC device, e.g., a memory circuit, logic device, processing device, signal processing circuit, or the like.

In some embodiments, some or all of method 2000 is executed by a processor of a computer. In some embodiments, some or all of method 2000 is executed by a processor 2102 of EDA system 2100, discussed below with respect to FIG. 21.

Some or all of the operations of method 2000 are capable of being performed as part of a design procedure performed in a design house, e.g., design house 2220 discussed below with respect to FIG. 22.

In some embodiments, the operations of method 2000 are performed in the order depicted in FIG. 20. In some embodiments, the operations of method 2000 are performed simultaneously and/or in an order other than the order depicted in FIG. 20. In some embodiments, one or more operations are performed before, between, during, and/or after performing one or more operations of method 2000.

At operation 2010, in some embodiments, first and second metal zero regions are aligned along tracks separated by three times a metal zero track pitch. In some embodiments, aligning the first and second metal zero regions along tracks separated by three times a metal zero track pitch includes aligning metal zero regions ZR1 and ZR4 along respective tracks T1 and T4 separated by three times metal zero track pitch ZP, discussed above with respect to FIGS. 2-18.

In some embodiments, aligning the first and second metal zero regions includes aligning first through fourth metal zero regions along consecutive first through fourth tracks having a metal zero track pitch. In some embodiments, aligning first through fourth metal zero regions along consecutive first through fourth tracks includes aligning metal zero regions ZR1-ZR4 along tracks T1-T4 having metal zero track pitch ZP, discussed above with respect to FIGS. 2-18.

At operation 2020, a first active region is overlapped with the first metal zero region, the first active region including first and second PMOS transistors and a first portion included in one of the PMOS transistors. Overlapping the first active region with the first metal zero region includes the first active region and the first metal zero region having orientations in a same orientation direction. In some embodiments, the orientation direction is the X direction discussed above with respect to FIGS. 2-18.

In various embodiments, overlapping the first active region with the first metal zero region includes aligning one or more borders of the first active region and first metal zero region along a direction perpendicular to the orientation direction, or overlapping the first active region with the first metal zero region without aligning a border along the perpendicular direction.

In various embodiments, overlapping the first portion included in one of the PMOS transistors includes overlapping a single portion of the first active region shared by the first and second PMOS transistors, or overlapping separate first and second portions of the first active region included in the first and second PMOS transistors separately.

In some embodiments, overlapping the first active region with the first metal zero region includes overlapping active region AR1 with metal zero region ZR1 discussed above with respect to FIGS. 2-18.

In some embodiments, overlapping the first active region with the first metal zero region is performed along with operation 2030, discussed below, as part of spanning the region including first and second active regions as discussed above with respect to metal zero regions ZR1-ZR4 and FIGS. 2-18.

At operation 2030, a second active region is overlapped with the second metal zero region, the second active region including first and second NMOS transistors and a second portion included in one of the NMOS transistors. Overlapping the second active region with the second metal zero region includes the second active region and the second metal zero region having orientations in the orientation direction.

In various embodiments, overlapping the second active region with the second metal zero region includes aligning one or more borders of the second active region and second metal zero region along the perpendicular direction, or overlapping the second active region with the second metal zero region without aligning a border along the perpendicular direction.

In various embodiments, overlapping the second portion included in one of the NMOS transistors includes overlapping a single portion of the second active region shared by the first and second NMOS transistors, or overlapping separate first and second portions of the second active region included in the first and second NMOS transistors separately.

In some embodiments, overlapping the second active region with the second metal zero region includes overlapping active region AR2 with metal zero region ZR4 discussed above with respect to FIGS. 2-18.

In some embodiments, overlapping the second active region with the second metal zero region is performed along with operation 2020, discussed above, as part of spanning the region including first and second active regions as discussed above with respect to metal zero regions ZR1-ZR4 and FIGS. 2-18.

At operation 2040, the first portion is overlapped with a first conductive region perpendicular to the first and second metal zero regions, and the second portion is overlapped with a second conductive region perpendicular to the first and second metal zero regions. Overlapping the first and second portions is part of arranging one or more conductive regions corresponding to a conductive path in the transmission gate that includes the first portion of the first active area and the second portion of the second active area.

In various embodiments, overlapping the first portion includes overlapping a single portion of the first active region shared by the first and second PMOS transistors, or overlapping separate first and second portions of the first active region included in the first and second PMOS transistors separately, and overlapping the second portion includes overlapping a single portion of the second active region shared by the first and second NMOS transistors, or overlapping separate first and second portions of the second active region included in the first and second NMOS transistors separately.

In some embodiments, arranging the one or more conductive regions corresponding to a conductive path is part of arranging one or more conductive regions corresponding to three conductive paths. In some embodiments, arranging one or more conductive regions corresponding to three conductive paths includes arranging one or more conductive regions corresponding to conductive paths PA, PB, and PC discussed above with respect to FIGS. 1-18.

In some embodiments, at least one of overlapping the first portion with the first conductive region or overlapping the second portion with the second conductive region includes defining an MD region. In some embodiments, defining an MD region includes defining one or more of MD regions MD1-MD14 discussed above with respect to FIGS. 2-18.

In some embodiments, at least one of overlapping the first portion with the first conductive region or overlapping the second portion with the second conductive region includes defining a region of a metal one layer of a manufacturing process. In some embodiments, defining the region of the metal one layer includes defining one or more of metal one regions 1R1 or 1R2 discussed above with respect to FIGS. 2-18.

In some embodiments, overlapping the first portion with the first conductive region and overlapping the second portion with the second conductive region include overlapping the first and second portions with a same conductive region. In some embodiments, overlapping the first and second portions with the same conductive region includes overlapping the first and second portions with one of MD regions MD1-MD14 or one of metal one regions 1R1 or 1R2 discussed above with respect to FIGS. 2-18.

In some embodiments, at least one of overlapping the first portion with the first conductive region or overlapping the second portion with the second conductive region includes overlapping at least two of the first through fourth metal zero regions with the first or second conductive region. In some embodiments, overlapping at least two of the first through fourth metal zero regions includes overlapping at least two of metal zero regions ZR1-ZR4 discussed above with respect to FIGS. 2-18.

In some embodiments overlapping the first portion with the first conductive region and overlapping the second portion with the second conductive region include overlapping each of the first through fourth metal zero regions with the same conductive region. In some embodiments, overlapping each of the first through fourth metal zero regions includes overlapping each of metal zero regions ZR1-ZR4 discussed above with respect to FIGS. 2-18.

In some embodiments overlapping the first portion with the first conductive region and overlapping the second portion with the second conductive region include overlapping each of the first and second active regions with the same conductive region. In some embodiments, overlapping each of the first and second active regions includes overlapping each of active regions AR1 and AR2 discussed above with respect to FIGS. 2-18.

At operation 2050, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 2114 of EDA system 2100, discussed below with respect to FIG. 21.

At operation 2060, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 22.

At operation 2070, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 22.

By executing some or all of the operations of method 2000, an IC layout diagram, e.g., one of IC layout diagrams 200A-1800A, is generated in which a transmission gate includes a conductive region perpendicular to a total of four metal zero regions spanning two active regions, and is thereby configured to provide the benefits discussed above with respect to IC layout diagrams 200A-1800A.

Figure 21:
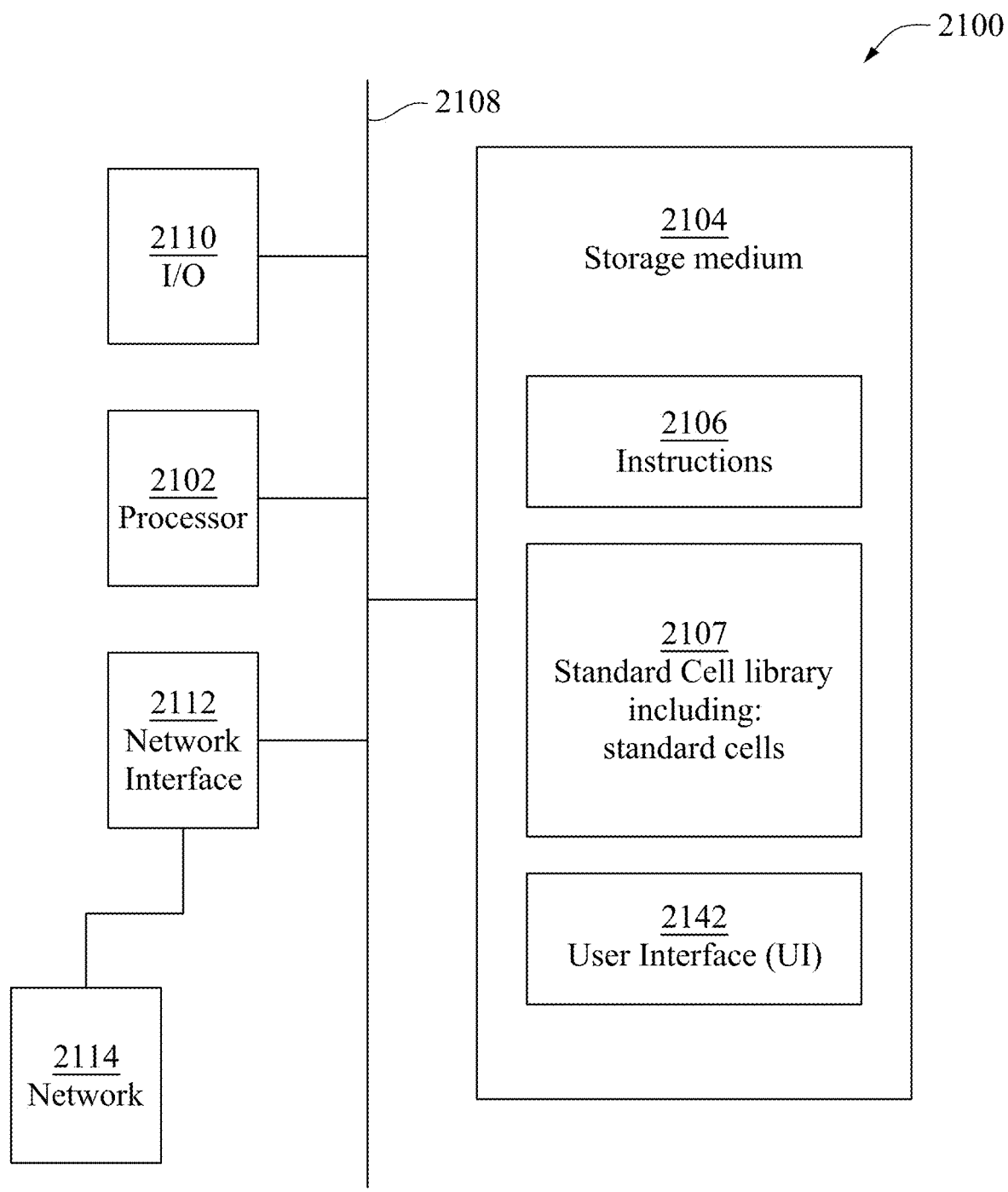
FIG. 21 is a block diagram of an electronic design automation (EDA) system, in accordance with some embodiments.

FIG. 21 is a block diagram of an electronic design automation (EDA) system 700, in accordance with some embodiments.

In some embodiments, EDA system 2100 includes an APR system. Methods described herein of designing layout diagrams representing wire routing arrangements, in accordance with one or more embodiments, are implementable, for example, using EDA system 2100, in accordance with some embodiments.

In some embodiments, EDA system 2100 is a general purpose computing device including a processor 2102 and a non-transitory, computer-readable storage medium 2104. Computer-readable storage medium 2104, amongst other things, is encoded with, i.e., stores, computer program code 2106, i.e., a set of executable instructions. Execution of instructions 2106 by processor 2102 represents (at least in part) an EDA tool which implements a portion or all of, e.g., method 2000 described above with respect to FIG. 20 (hereinafter, the noted processes and/or methods).

Processor 2102 is electrically coupled to computer-readable storage medium 2104 via a bus 2108. Processor 2102 is also electrically coupled to an I/O interface 2110 by bus 2108. A network interface 2112 is also electrically connected to processor 2102 via bus 2108. Network interface 2112 is connected to a network 2114, so that processor 2102 and computer-readable storage medium 2104 are capable of connecting to external elements via network 2114. Processor 2102 is configured to execute computer program code 2106 encoded in computer-readable storage medium 2104 in order to cause system 2100 to be usable for performing a portion or all of the noted processes and/or methods. In one or more embodiments, processor 2102 is a central processing unit (CPU), a multi-processor, a distributed processing system, an application specific integrated circuit (ASIC), and/or a suitable processing unit.

In one or more embodiments, computer-readable storage medium 2104 is an electronic, magnetic, optical, electromagnetic, infrared, and/or a semiconductor system (or apparatus or device). For example, computer-readable storage medium 2104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 2104 includes a compact disk-read only memory (CD-ROM), a compact disk-read/write (CD-R/W), and/or a digital video disc (DVD).

In one or more embodiments, computer-readable storage medium 2104 stores computer program code 2106 configured to cause system 2100 (where such execution represents (at least in part) the EDA tool) to be usable for performing a portion or all of the noted processes and/or methods. In one or more embodiments, computer-readable storage medium 2104 also stores information which facilitates performing a portion or all of the noted processes and/or methods. In one or more embodiments, computer-readable storage medium 2104 stores library 2107 of standard cells including transmission gate IC layout diagrams as disclosed herein, e.g., one or more of IC layout diagrams 200A-1800A discussed above with respect to FIGS. 2-18.

EDA system 700 includes I/O interface 2110. I/O interface 2110 is coupled to external circuitry. In one or more embodiments, I/O interface 2110 includes a keyboard, keypad, mouse, trackball, trackpad, touchscreen, and/or cursor direction keys for communicating information and commands to processor 2102.

EDA system 2100 also includes network interface 2112 coupled to processor 2102. Network interface 2112 allows system 2100 to communicate with network 2114, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 2100.

System 2100 is configured to receive information through I/O interface 2110. The information received through I/O interface 2110 includes one or more of instructions, data, design rules, libraries of standard cells, and/or other parameters for processing by processor 2102. The information is transferred to processor 2102 via bus 2108. EDA system 2100 is configured to receive information related to a UI through I/O interface 2110. The information is stored in computer-readable medium 2104 as user interface (UI) 2142.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 2100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 22:
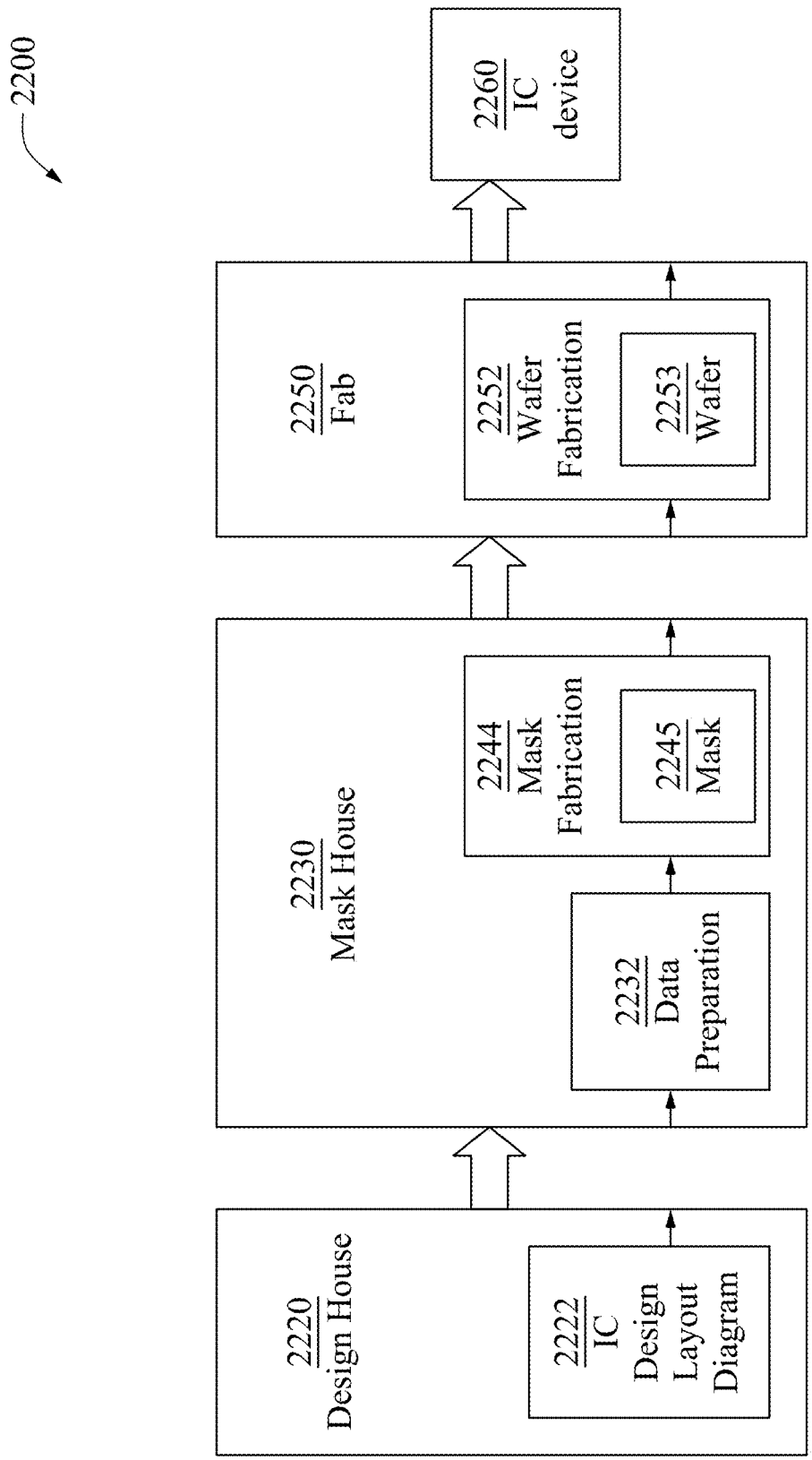
FIG. 22 is a block diagram of an IC manufacturing system, and an IC manufacturing flow associated therewith, in accordance with some embodiments.

FIG. 22 is a block diagram of IC manufacturing system 2200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 2200.

In FIG. 22, IC manufacturing system 2200 includes entities, such as a design house 2220, a mask house 2230, and an IC manufacturer/fabricator ("fab") 2250, that interact with one another in the design, development, and manufacturing cycles and/or services related to manufacturing an IC device 2260. The entities in system 2200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 2220, mask house 2230, and IC fab 2250 is owned by a single larger company. In some embodiments, two or more of design house 2220, mask house 2230, and IC fab 2250 coexist in a common facility and use common resources.

Design house (or design team) 2220 generates an IC design layout diagram 2222. IC design layout diagram 2222 includes various geometrical patterns, e.g., one or more of IC layout diagram 200A-1800A discussed above with respect to FIGS. 2-18, designed for an IC device 2260, e.g., an IC device including one or more of IC structures 200A-1800A, discussed above with respect to FIGS. 2-18. The geometrical patterns correspond to patterns of metal, oxide, or semiconductor layers that make up the various components of IC device 2260 to be fabricated. The various layers combine to form various IC features. For example, a portion of IC design layout diagram 2222 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 2220 implements a proper design procedure to form IC design layout diagram 2222. The design procedure includes one or more of logic design, physical design or place and route. IC design layout diagram 2222 is presented in one or more data files having information of the geometrical patterns. For example, IC design layout diagram 2222 can be expressed in a GDSII file format or DFII file format.

Mask house 2230 includes data preparation 2232 and mask fabrication 2244. Mask house 2230 uses IC design layout diagram 2222 to manufacture one or more masks 2245 to be used for fabricating the various layers of IC device 2260 according to IC design layout diagram 2222. Mask house 2230 performs mask data preparation 2232, where IC design layout diagram 2222 is translated into a representative data file ("RDF"). Mask data preparation 2232 provides the RDF to mask fabrication 2244. Mask fabrication 2244 includes a mask writer. A mask writer converts the RDF to an image on a substrate, such as a mask (reticle) 2245 or a semiconductor wafer 2253. The design layout diagram 2222 is manipulated by mask data preparation 2232 to comply with particular characteristics of the mask writer and/or requirements of IC fab 2250. In FIG. 22, mask data preparation 2232 and mask fabrication 2244 are illustrated as separate elements. In some embodiments, mask data preparation 2232 and mask fabrication 2244 can be collectively referred to as mask data preparation.

In some embodiments, mask data preparation 2232 includes optical proximity correction (OPC) which uses lithography enhancement techniques to compensate for image errors, such as those that can arise from diffraction, interference, other process effects and the like. OPC adjusts IC design layout diagram 2222. In some embodiments, mask data preparation 2232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 2232 includes a mask rule checker (MRC) that checks the IC design layout diagram 2222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 2222 to compensate for limitations during mask fabrication 2244, which may undo part of the modifications performed by OPC in order to meet mask creation rules.

In some embodiments, mask data preparation 2232 includes lithography process checking (LPC) that simulates processing that will be implemented by IC fab 2250 to fabricate IC device 2260. LPC simulates this processing based on IC design layout diagram 2222 to create a simulated manufactured device, such as IC device 2260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 2222.

It should be understood that the above description of mask data preparation 2232 has been simplified for the purposes of clarity. In some embodiments, data preparation 2232 includes additional features such as a logic operation (LOP) to modify the IC design layout diagram 2222 according to manufacturing rules. Additionally, the processes applied to IC design layout diagram 2222 during data preparation 2232 may be executed in a variety of different orders.

After mask data preparation 2232 and during mask fabrication 2244, a mask 2245 or a group of masks 2245 are fabricated based on the modified IC design layout diagram 2222. In some embodiments, mask fabrication 2244 includes performing one or more lithographic exposures based on IC design layout diagram 2222. In some embodiments, an electron-beam (e-beam) or a mechanism of multiple e-beams is used to form a pattern on a mask (photomask or reticle) 2245 based on the modified IC design layout diagram 2222. Mask 2245 can be formed in various technologies. In some embodiments, mask 2245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 2245 includes a transparent substrate (e.g., fused quartz) and an opaque material (e.g., chromium) coated in the opaque regions of the binary mask. In another example, mask 2245 is formed using a phase shift technology. In a phase shift mask (PSM) version of mask 2245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 2244 is used in a variety of processes. For example, such a mask(s) is used in an ion implantation process to form various doped regions in semiconductor wafer 2253, in an etching process to form various etching regions in semiconductor wafer 2253, and/or in other suitable processes.

IC fab 2250 includes wafer fabrication 2252. IC fab 2250 is an IC fabrication business that includes one or more manufacturing facilities for the fabrication of a variety of different IC products. In some embodiments, IC Fab 2250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 2250 uses mask(s) 2245 fabricated by mask house 2230 to fabricate IC device 2260. Thus, IC fab 2250 at least indirectly uses IC design layout diagram 2222 to fabricate IC device 2260. In some embodiments, semiconductor wafer 2253 is fabricated by IC fab 2250 using mask(s) 2245 to form IC device 2260. In some embodiments, the IC fabrication includes performing one or more lithographic exposures based at least indirectly on IC design layout diagram 2222. Semiconductor wafer 2253 includes a silicon substrate or other proper substrate having material layers formed thereon. Semiconductor wafer 2253 further includes one or more of various doped regions, dielectric features, multi-level interconnects, and the like (formed at subsequent manufacturing steps).

Details regarding an integrated circuit (IC) manufacturing system (e.g., system 2200 of FIG. 22), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a transmission gate structure includes first and second PMOS transistors in a first active area, first and second NMOS transistors in a second active area, a first metal zero segment overlying the first active area, a second metal zero segment offset from the first metal zero segment by an offset distance, a third metal zero segment offset from the second metal zero segment by the offset distance, a fourth metal zero segment offset from the third metal zero segment by the offset distance and overlying the second active area, a first conductive segment overlying a first portion of the first active area, the first portion being included in the first and/or second PMOS transistor, and a second conductive segment overlying a second portion of the second active area, the second portion being included in the first and/or second NMOS transistor. Each of the first and second active areas and first through fourth metal zero segments is oriented along a first direction, each of the first and second conductive segments is oriented along a second direction perpendicular to the first direction, and the first and second PMOS transistors and the first and second NMOS transistors are coupled to each other through a conductive path including the first and second conductive segments. In some embodiments, each of the first and second conductive segments includes a corresponding first or second MD segment contacting the corresponding first or second portion, and the conductive path includes a first via structure electrically connecting the first MD segment to a corresponding one of the first or fourth metal zero segments, a second via structure electrically connecting the second MD segment to the corresponding other of the first or fourth metal zero segments, a third via structure electrically connecting the corresponding one of the first or fourth metal zero segments to a metal one segment, and a fourth via structure electrically connecting the corresponding other of the first or fourth metal zero segments to the metal one segment. In some embodiments, the conductive path includes a third MD segment overlying and contacting a third portion of one of the first or second active areas, the third portion being included in one of the first or second PMOS transistors or the first or second NMOS transistors, and a fifth via structure electrically connecting the third MD segment with a corresponding one of the first or fourth metal zero segments. In some embodiments, the conductive path includes a fourth MD segment overlying and contacting a fourth portion of one of the first or second active area, the fourth portion being included in one of the first or second PMOS transistors or the first or second NMOS transistors, and a sixth via structure electrically connecting the fourth MD segment with a corresponding one of the first or fourth metal zero segments. In some embodiments, the third via structure overlies the first via structure, and each of the second via structure and the fifth via structure is offset from the fourth via structure in the first direction along the corresponding one of the first or fourth metal zero segments. In some embodiments, each of the first and second conductive segments includes a corresponding first or second MD segment contacting the corresponding first or second portion, and the conductive path includes a first via structure electrically connecting the first MD segment to one of the second or third metal zero segments, and a second via structure electrically connecting the second MD segment to the one of the second or third metal zero segments. In some embodiments, the transmission gate structure includes a first gate structure and a second gate structure, and at least one of the first or second gate structures is included in one of the first or second PMOS transistors and one of the first or second NMOS transistors.

In some embodiments, a transmission gate structure includes first and second PMOS transistors in a first active area, first and second NMOS transistors in a second active area, a first metal zero segment overlying the first active area, a second metal zero segment offset from the first metal zero segment by an offset distance, a third metal zero segment offset from the second metal zero segment by the offset distance, a fourth metal zero segment offset from the third metal zero segment by the offset distance and overlying the second active area, and a conductive segment overlying a first portion of the first active area and a second portion of the second active area. The first portion is included in the first and/or second PMOS transistor, the second portion is included in the first and/or second NMOS transistor, each of the first and second active areas and first through fourth metal zero segments is oriented along a first direction, the conductive segment is oriented along a second direction perpendicular to the first direction, and the first and second PMOS transistors and the first and second NMOS transistors are coupled to each other through a conductive path including the conductive segment. In some embodiments, the conductive path is a first conductive path, a first gate structure of one of the first or second PMOS transistors and a second gate structure of one of the first or second NMOS transistors are coupled to each other through a second conductive path, and the second conductive path includes one of the second or third metal zero segments extending from the first gate structure to the second gate structure. In some embodiments, the conductive segment includes a metal one segment overlying the one of the second or third metal zero segments extending from the first gate structure to the second gate structure. In some embodiments, the conductive segment includes an MD segment contacting each of the first and second portions, and the one of the second or third metal zero segments extending from the first gate structure to the second gate structure overlies the MD segment. In some embodiments, the first portion is included in the first and second PMOS transistors, the second portion is included in the first and second NMOS transistors, a first gate structure is included in the first PMOS transistor and the second NMOS transistor, a second gate structure is included in the second PMOS transistor and the first NMOS transistor, and the conductive segment includes an MD segment contacting each of the first and second portions. In some embodiments, the conductive segment includes a first MD segment contacting each of the first and second portions, and the conductive path includes a second MD segment contacting a third portion of one of the first or second active areas, the third portion being included in one of the first or second PMOS transistors or the first or second NMOS transistors, a first via structure electrically connecting the first MD segment to one of the second or third metal zero segments, and a second via structure electrically connecting the second MD segment to the one of the second or third metal zero segments. In some embodiments, the first conductive segment includes an MD segment contacting each of the first and second portions, the conductive path is a first conductive path, a second conductive path includes a first via structure overlying the first active area and a gate structure of the first PMOS transistor or the second active area and a gate structure of the second NMOS transistor, and/or a third conductive path includes a second via structure overlying the first active area and a gate structure of the second PMOS transistor or the second active area and a gate structure of the first NMOS transistor.

In some embodiments, a method of manufacturing a transmission gate includes overlying a first active area with a first metal zero segment, the first active area including first and second PMOS transistors, overlying a second active area with a second metal zero segment, the second active area including first and second NMOS transistors, and configuring the first and second PMOS transistors and the first and second NMOS transistors as a transmission gate by forming three conductive paths. At least one of the conductive paths includes a first conductive segment perpendicular to the first and second metal zero segments, and the first and second metal zero segments have a first offset distance corresponding to three times a metal zero pitch. In some embodiments, overlying the first and second active areas with the first and second metal zero segments includes forming a total of two metal zero segments between the first and second metal zero segments, each of the corresponding total of four metal zero segments thereby being offset from one or two adjacent metal zero segments by a second offset distance equal to the metal zero pitch. In some embodiments, forming the at least one of the conductive paths including the first conductive segment includes forming the first conductive segment overlying at least one of a first portion of the first active area included in the first and/or second PMOS transistor or a second portion of the second active area included in the first and/or second NMOS transistor. In some embodiments, forming the at least one of the conductive paths including the first conductive segment includes forming the first conductive segment including a metal one segment overlying each of a first portion of the first active area included in the first and/or second PMOS transistor and a second portion of the second active area included in the first and/or second NMOS transistor. In some embodiments, forming the at least one of the conductive paths including the first conductive segment includes forming the first conductive segment comprising an MD segment overlying and contacting each of a first portion of the first active area included in the first and/or second PMOS transistor and a second portion of the second active area included in the first and/or second NMOS transistor. In some embodiments, configuring the first and second PMOS transistors and the first and second NMOS transistors as a transmission gate by forming three conductive paths includes forming a first via structure overlying the first active area and a gate structure of the first or second PMOS transistor, and forming a second via structure overlying the second active area and a gate structure of the first or second NMOS transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transmission gate structure comprising:
   first and second PMOS transistors in a first active area;
   first and second NMOS transistors in a second active area;
   a first metal zero segment overlying the first active area;
   a second metal zero segment offset from the first metal zero segment by an offset distance;
   a third metal zero segment offset from the second metal zero segment by the offset distance;
   a fourth metal zero segment offset from the third metal zero segment by the offset distance and overlying the second active area;
   a first conductive segment overlying a first portion of the first active area, the first portion being included in the first and/or second PMOS transistor; and
   a second conductive segment overlying a second portion of the second active area, the second portion being included in the first and/or second NMOS transistor,
   wherein
      each of the first and second active areas and first through fourth metal zero segments is oriented along a first direction,
      each of the first and second conductive segments is oriented along a second direction perpendicular to the first direction, and
      the first and second PMOS transistors and the first and second NMOS transistors are coupled to each other through a conductive path comprising the first and second conductive segments.

2. The transmission gate structure of claim 1, wherein
   each of the first and second conductive segments comprises a corresponding first or second metal-like defined (MD) segment contacting the corresponding first or second portion, and
   the conductive path comprises:
      a first via structure electrically connecting the first MD segment to a corresponding one of the first or fourth metal zero segments;
      a second via structure electrically connecting the second MD segment to the corresponding other of the first or fourth metal zero segments;
      a third via structure electrically connecting the corresponding one of the first or fourth metal zero segments to a metal one segment; and
      a fourth via structure electrically connecting the corresponding other of the first or fourth metal zero segments to the metal one segment.

3. The transmission gate structure of claim 2, wherein the conductive path comprises:
   a third MD segment overlying and contacting a third portion of one of the first or second active areas, the third portion being included in one of the first or second PMOS transistors or the first or second NMOS transistors; and
   a fifth via structure electrically connecting the third MD segment with a corresponding one of the first or fourth metal zero segments.

4. The transmission gate structure of claim 3, wherein the conductive path comprises:
   a fourth MD segment overlying and contacting a fourth portion of one of the first or second active area, the fourth portion being included in one of the first or second PMOS transistors or the first or second NMOS transistors; and
   a sixth via structure electrically connecting the fourth MD segment with a corresponding one of the first or fourth metal zero segments.

5. The transmission gate structure of claim 3, wherein the third via structure overlies the first via structure, and each of the second via structure and the fifth via structure is offset from the fourth via structure in the first direction along the corresponding one of the first or fourth metal zero segments.

6. The transmission gate structure of claim 1, wherein each of the first and second conductive segments comprises a corresponding first or second metal-like defined (MD) segment contacting the corresponding first or second portion, and
the conductive path comprises:
  a first via structure electrically connecting the first MD segment to one of the second or third metal zero segments; and
  a second via structure electrically connecting the second MD segment to the one of the second or third metal zero segments.

7. The transmission gate structure of claim 1, further comprising a first gate structure and a second gate structure, wherein at least one of the first or second gate structures is included in one of the first or second PMOS transistors and one of the first or second NMOS transistors.

8. A transmission gate structure comprising:
first and second PMOS transistors in a first active area;
first and second NMOS transistors in a second active area;
a first metal zero segment overlying the first active area;
a second metal zero segment offset from the first metal zero segment by an offset distance;
a third metal zero segment offset from the second metal zero segment by the offset distance;
a fourth metal zero segment offset from the third metal zero segment by the offset distance and overlying the second active area; and
a conductive segment overlying a first portion of the first active area and a second portion of the second active area,
wherein
  the first portion is included in the first and/or second PMOS transistor,
  the second portion is included in the first and/or second NMOS transistor,
  each of the first and second active areas and first through fourth metal zero segments is oriented along a first direction,
  the conductive segment is oriented along a second direction perpendicular to the first direction, and
  the first and second PMOS transistors and the first and second NMOS transistors are coupled to each other through a conductive path comprising the conductive segment.

9. The transmission gate structure of claim 8, wherein the conductive path is a first conductive path,
a first gate structure of one of the first or second PMOS transistors and a second gate structure of one of the first or second NMOS transistors are coupled to each other through a second conductive path, and
the second conductive path comprises one of the second or third metal zero segments extending from the first gate structure to the second gate structure.

10. The transmission gate structure of claim 9, wherein the conductive segment comprises a metal one segment overlying the one of the second or third metal zero segments extending from the first gate structure to the second gate structure.

11. The transmission gate structure of claim 9, wherein the conductive segment comprises a metal-like defined (MD) segment contacting each of the first and second portions, and the one of the second or third metal zero segments extending from the first gate structure to the second gate structure overlies the MD segment.

12. The transmission gate structure of claim 8, wherein the first portion is included in the first and second PMOS transistors,
the second portion is included in the first and second NMOS transistors,
a first gate structure is included in the first PMOS transistor and the second NMOS transistor,
a second gate structure is included in the second PMOS transistor and the first NMOS transistor, and
the conductive segment comprises a metal-like defined (MD) segment contacting each of the first and second portions.

13. The transmission gate structure of claim 8, wherein the conductive segment comprises a first metal-like defined (MD) segment contacting each of the first and second portions, and
the conductive path comprises:
  a second MD segment contacting a third portion of one of the first or second active areas, the third portion being included in one of the first or second PMOS transistors or the first or second NMOS transistors;
  a first via structure electrically connecting the first MD segment to one of the second or third metal zero segments; and
  a second via structure electrically connecting the second MD segment to the one of the second or third metal zero segments.

14. The transmission gate structure of claim 1, wherein the first conductive segment comprises a metal-like defined (MD) segment contacting each of the first and second portions,
the conductive path is a first conductive path,
a second conductive path comprises a first via structure overlying the first active area and a gate structure of the first PMOS transistor or the second active area and a gate structure of the second NMOS transistor, and/or
a third conductive path comprises a second via structure overlying the first active area and a gate structure of the second PMOS transistor or the second active area and a gate structure of the first NMOS transistor.

15. A transmission gate structure comprising:
first and second PMOS transistors in a first active area extending in a first direction;
first and second NMOS transistors in a second active area extending in the first direction;
a first metal segment overlying the first active area along the first direction;
a second metal segment offset from the first metal segment by an offset distance;
a third metal segment offset from the second metal segment by the offset distance;
a fourth metal segment offset from the third metal segment by the offset distance and overlying the second active area along the first direction; and
a first conductive segment extending across at least three of the first through fourth metal segments in a second direction perpendicular to the first direction,
wherein
  the first conductive segment overlies a first portion of the first or second active area, the first portion being included in one of the first and second PMOS transistors or the first and second NMOS transistors, and the first and second PMOS transistors and the first and second NMOS transistors are coupled to each other through a conductive path comprising the first conductive segment.

16. The transmission gate structure of claim 15, wherein the first conductive segment overlies each of the first through fourth metal segments.

17. The transmission gate structure of claim 16, further comprising a gate structure included in each of the second PMOS transistor and the first NMOS transistor or each of the first PMOS transistor and the second NMOS transistor.

18. The transmission gate structure of claim 15, wherein each of the first through fourth metal segments overlies the first conductive segment.

19. The transmission gate structure of claim 15, wherein
 each of the second and third metal segments overlies the first conductive segment, and
 the first conductive segment overlies a second portion of the first or second active area, the second portion being included in the other of the first and second PMOS transistors or the first and second NMOS transistors.

20. The transmission gate structure of claim 15, further comprising a second conductive segment extending in the second direction, wherein
 each of the second and third metal segments overlies the first conductive segment,
 the second conductive segment overlies a second portion of the first or second active area, the second portion being included in the other of the first and second PMOS transistors or the first and second NMOS transistors, and
 the second or third metal segment overlies the second conductive segment and is configured to electrically connect the first and second conductive segments to each other.

* * * * *